US007569417B2

(12) United States Patent
Lee et al.

(10) Patent No.: US 7,569,417 B2
(45) Date of Patent: Aug. 4, 2009

(54) METHOD OF FORMING A PHASE CHANGEABLE MATERIAL LAYER, A METHOD OF MANUFACTURING A PHASE CHANGEABLE MEMORY UNIT, AND A METHOD OF MANUFACTURING A PHASE CHANGEABLE SEMICONDUCTOR MEMORY DEVICE

(75) Inventors: Jin-Il Lee, Seongnam-si (KR); Choong-Man Lee, Seoul (KR); Sung-Lae Cho, Yongin-si (KR); Young-Lim Park, Anyang-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 444 days.

(21) Appl. No.: 11/353,129

(22) Filed: Feb. 14, 2006

(65) Prior Publication Data
US 2007/0054475 A1    Mar. 8, 2007

(30) Foreign Application Priority Data
Sep. 3, 2005    (KR) .................. 10-2005-0081965

(51) Int. Cl.
   *H01L 45/00*    (2006.01)
(52) U.S. Cl. .................. 438/102; 257/E31.027; 257/E31.029; 438/95
(58) Field of Classification Search ........... 438/95, 438/102; 257/E31.027, E31.029
   See application file for complete search history.

(56) References Cited
U.S. PATENT DOCUMENTS
5,596,522 A    1/1997    Ovshinsky et al.
5,825,046 A    10/1998    Czubatyj et al.
7,005,665 B2 *    2/2006    Furkay et al. .................. 257/2
7,265,373 B2 *    9/2007    Wang et al. .................... 257/4
2004/0224504 A1 *    11/2004    Gadgil ....................... 438/680

FOREIGN PATENT DOCUMENTS
KR    10-2004-0088938    10/2004

* cited by examiner

*Primary Examiner*—Asok K Sarkar
(74) *Attorney, Agent, or Firm*—Stanzione & Kim, LLP

(57) ABSTRACT

A phase changeable material layer usable in a semiconductor memory device and a method of forming the same are disclosed. The method includes forming a plasma in a chamber having a substrate disposed therein, providing a first source gas including a germanium based material to form a first layer including the germanium based material on the substrate while maintaining the plasma in the chamber, providing a second source gas including a tellurium based material to react with the first layer to form a first composite material layer including a germanium-tellurium composite material on the substrate while maintaining the plasma in the chamber, providing a third source gas including an antimony based material to form a second layer including the antimony based material on the first composite material layer while maintaining the plasma in the chamber, and providing a fourth source gas including tellurium based material to react with the second layer including antimony based material to form a second composite material layer including an antimony-tellurium composite material on the first composite material layer. Accordingly, the phase changeable material layer may be formed at a low temperature and power to have desirable electrical characteristics.

27 Claims, 25 Drawing Sheets

METHOD OF FORMING A PHASE CHANGEABLE MATERIAL LAYER, A METHOD OF MANUFACTURING A PHASE CHANGEABLE MEMORY UNIT, AND A METHOD OF MANUFACTURING A PHASE CHANGEABLE SEMICONDUCTOR MEMORY DEVICE

CROSS-REFERENCE TO RELATED APPLICATIONS

This application claims the benefit under 35 U.S.C. § 119(a) of Korean Patent Application No. 2005-81965, filed Sep. 3, 2005 in the Korean Intellectual Property Office, the entire contents of which are incorporated herein by reference

BACKGROUND OF THE INVENTION

1. Field of the Invention

Example embodiments of the present invention relate to a method of forming a phase changeable material layer, a method of manufacturing a phase changeable memory unit, and a phase changeable semiconductor memory device using the same. More particularly, example embodiments of the present invention relates a method of forming a phase changeable material layer including chalcogenide, a method of manufacturing a phase changeable memory unit using the same, and a phase changeable semiconductor memory device using the same.

2. Description of the Related Art

A phase changeable memory device stores information using structural phase changes in certain thin-film alloys that typically utilize one or more elements from Column VI of the periodic table. These alloys are stable in both (a) a crystalline state in which the atoms are arranged in a regular periodic structure and (b) an amorphous state with an irregular atomic structure. The two states have different electrical and optical characteristics and can be switched therebetween by applying a pulse of energy. The crystalline state typically has a low resistance and is highly reflective, and the amorphous state typically has a high resistance and a dull appearance. These phase changeable alloys are referred to as chalcogenide materials and include germanium (Ge), antimony (Sb), and tellurium (Te).

A conventional PVD (physical vapor deposition) process such as sputtering or evaporation deposition is typically used to form a phase changeable material layer such as a mixture of germanium, antimony, and tellurium (GST). However, when using the conventional PVD process, it is difficult to control a growth rate of the phase changeable material layer. Accordingly, the phase changeable material layer formed by the conventional PVD process is typically not dense, and it is difficult to form the phase changeable material layer to have a FCC (Face Centered Cubic) crystallization structure having excellent electrical characteristics.

When forming the phase changeable material layer using the PVD process, the electrical characteristics of the phase changeable material layer deteriorate because it is very difficult to precisely control a composition ratio of the germanium, tellurium and antimony in the GST mixture. Furthermore, the conventional PVD process is very expensive and time consuming, since a deposition rate is slow.

SUMMARY OF THE INVENTION

Accordingly, example embodiment of the present invention provide a method of forming a phase changeable material layer having excellent characteristics, while adjusting a composition ratio of the phase changeable material layer to an appropriate composition at a low temperature using a plasma process.

Example embodiments of the present invention also provide a method of fabricating a PRAM (Phase change Random Access Memory) unit using the method of forming the phase changeable material layer.

Example embodiments of the present invention also provide the PRAM unit using the method of forming the phase changeable material layer.

Additional aspects of the present invention will be set forth in part in the description which follows and, in part, will be obvious from the description, or may be learned by practice of the general inventive concept.

The foregoing and/or other aspects of the present invention are achieved by providing a method of fabricating a phase changeable material layer usable in a semiconductor memory device, the method including forming a plasma in a chamber having a substrate disposed therein, providing a first source gas including a germanium based material to form a first layer including the germanium based material on the substrate while maintaining the plasma in the chamber, providing a second source gas including a tellurium based material to react with the first layer to form a first composite material layer including a germanium-tellurium composite material on the substrate while maintaining the plasma in the chamber, providing a third source gas including an antimony based material to form a second layer including the antimony based material on the first composite material layer while maintaining the plasma in the chamber, and providing a fourth source gas including a tellurium based material to react with the second layer to form a second composite material layer including an antimony-tellurium composite material on the first composite material layer.

The foregoing and/or other aspects of the present invention are also achieved by providing a method of forming a phase changeable material layer on a substrate in a reaction chamber, the method including performing a plurality of first unit processes having one or more cycles to form germanium-tellurium layers, and performing a plurality of second unit processes having one or more cycles to form antimony-tellurium layers, wherein the first and the second unit processes are plasma assisted.

The foregoing and/or other aspects of the present invention are also achieved by providing a method of forming a phase changeable material layer in a reaction chamber, the method comprising performing alternating chemical vapor depositions on a substrate of one or more chalcogenide materials while maintaining a constant plasma in the reaction chamber.

The foregoing and/or other aspects of the present invention are also achieved by providing a method of forming a phase changeable material layer, the method including repeating a plasma assisted chemical vapor deposition cycle on a substrate. The plasma assisted chemical vapor deposition cycle includes producing plasma in a reaction chamber, introducing a plurality of a germanium based source gas, a tellurium based source gas and an antimony based source gas to react on the substrate, and purging the reaction chamber of each of an unreacted germanium based source gas, an unreacted tellurium based source gas, and an unreacted antimony based source gas.

The foregoing and/or other aspects of the present invention are also achieved by providing a method of forming a phase changeable material layer, the method including forming a plasma in a reaction chamber having a substrate therein, and supplying a germanium based source gas, an antimony based source gas, and a tellurium based source gas into the reaction chamber in flow amounts having a ratio of about 5 to 2-4 to 2-4 (5:2-4:2-4), respectively, to deposit layers on the substrate.

The foregoing and/or other aspects of the present invention are also achieved by providing a method of forming a phase changeable material layer using plasma assisted chemical vapor deposition, the method including feeding a first source gas of a first chalcogenide material into a reaction chamber for a first feed amount such that the first chalcogenide is chemisorbed on a substrate disposed in the reaction chamber, feeding a second source gas of a second chalcogenide material into the reaction chamber for a second feed amount such that the second chalcogenide material reacts with the first chalcogenide material to form at least one first composite material layer, feeding a third source gas of a third chalcogenide material into the reaction chamber for a third feed amount such that the third chalcogenide material is deposited on the at least one first composite material layer, and feeding the second source gas of the second chalcogenide material into the reaction chamber for a fourth feed amount such that the second chalcogenide material reacts with the third chalcogenide material to form at least one second composite material layer on the at least one first composite layer.

The foregoing and/or other aspects of the present invention are also achieved by providing a method of forming a phase changeable material, the method including creating a plasma source in a reaction chamber, introducing a second chalcogenide material into the reaction chamber to react with a first chalcogenide material to form a first layer, depositing a second layer of a third chalcogenide material on the first layer, and introducing more of the second chalcogenide material into the reaction chamber to react with the third chalcogenide material in the second layer.

The foregoing and/or other aspects of the present invention are also achieved by providing a method of fabricating a phase changeable memory device, the method including forming one or more insulating layers on a substrate, forming a first electrode on the one or more insulating layers, forming a phase changeable material to contact the first electrode by performing alternating chemical vapor depositions of germanium, antimony, and tellurium using a constant plasma source, and forming a second electrode to contact the phase changeable material on an opposite side of the first electrode.

The foregoing and/or other aspects of the present invention are also achieved by providing a method of fabricating a phase changeable memory device, the method including forming a lower electrode on a substrate, forming a phase changeable material layer on the lower electrode by performing a plurality of plasma assisted chemical vapor deposition operations of a plurality of chalcogenide materials, and forming an upper electrode on the phase changeable material layer.

The foregoing and/or other aspects of the present invention are also achieved by providing a phase changeable memory unit, including a substrate, a lower electrode structure disposed on the substrate, a phase changeable material layer disposed on the lower electrode structure and including first and second composite layers formed by alternating plasma assisted chemical vapor deposition cycles using alternating chalcogenide materials, and an upper electrode structure disposed on the phase changeable material layer.

The foregoing and/or other aspects of the present invention are also achieved by providing a phase changeable memory device, including a substrate, a terminal formed on the substrate, a first insulating layer formed on the substrate and having a lower contact extending therethrough to contact the terminal, a second insulating layer formed on the first insulating layer and including a lower electrode formed therein on the first insulating layer and the lower contact, a phase changeable material element disposed in the second insulating layer on the lower electrode and having an alternating arrangement of a first plurality of layers of a first composite material including germanium and tellurium and a second plurality of layers of a second composite material including antimony and tellurium, a third insulating layer formed on the second insulating layer and including an upper electrode formed therein on the second insulating layer and the phase changeable material element; and an upper contact formed on the third insulating layer to extend therethrough to contact the upper electrode.

The foregoing and/or other aspects of the present invention are also achieved by providing a phase changeable memory device, including at least one memory unit. The at least one memory unit includes a substrate having a plurality of terminal regions including one or more source regions, one or more drain regions, and one or more gate structures, one or more lower electrode contact structures arranged in electrical contact with one or more of the terminal regions on the substrate, one or more phase changeable material parts disposed on the substrate to contact the one or more lower electrode contact structures, and each of the phase changeable material parts having alternately formed composite chalcogenide layers, and one or more upper electrode contact structures disposed on the one or more phase changeable material parts to be in electrical contact therewith.

BRIEF DESCRIPTION OF THE DRAWINGS

These and/or other aspects of the present invention will become apparent and more readily appreciated from the following description of the example embodiments, taken in conjunction with the accompanying drawings of which.

DESCRIPTION OF THE EMBODIMENTS

Figure 1:
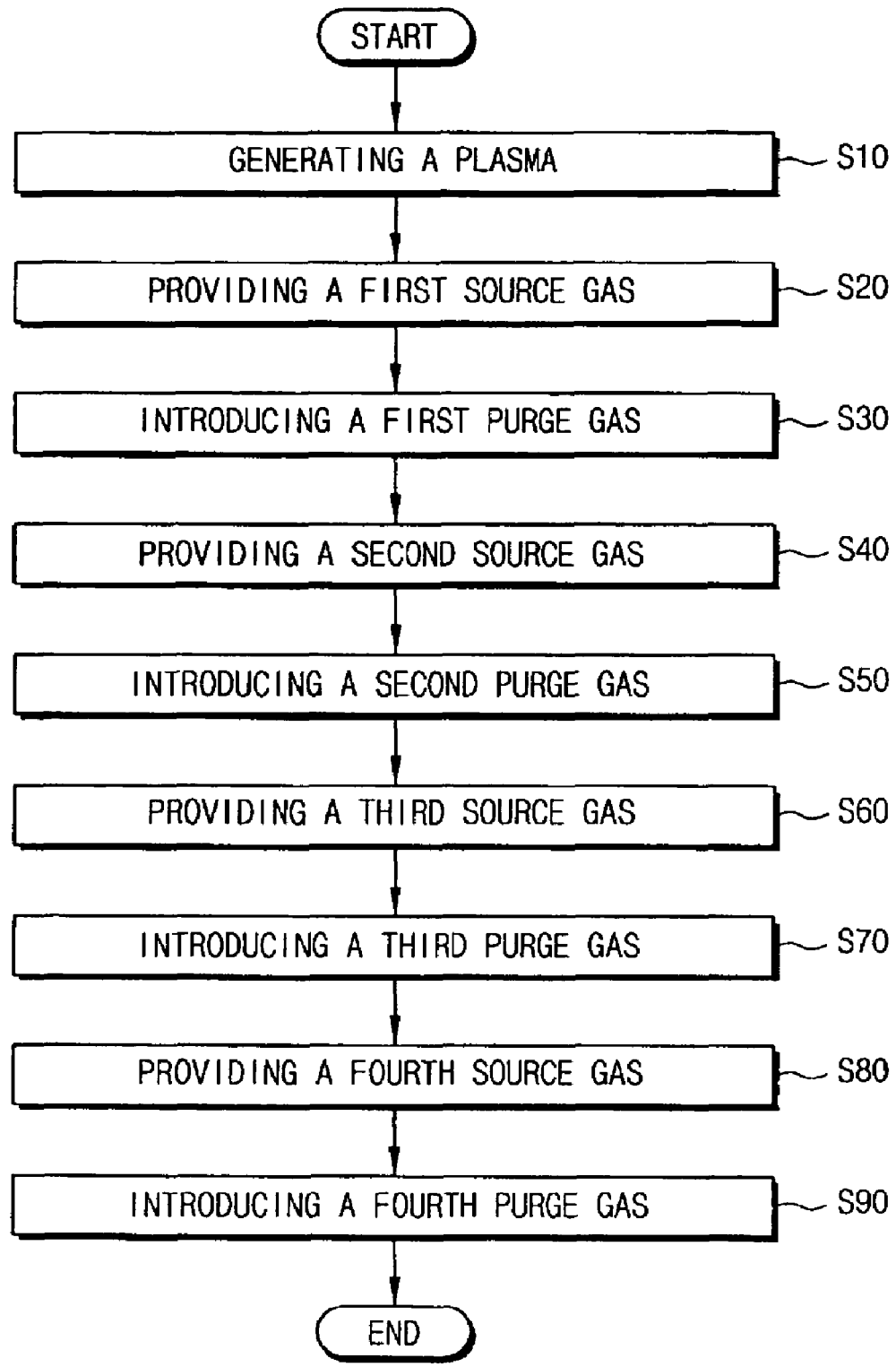
FIG. 1 is a flow chart illustrating a method of forming a phase changeable material layer according to an example embodiment of the present invention.

Reference will now be made in detail to the embodiments of the present invention, examples of which are illustrated in the accompanying drawings, wherein like reference numerals refer to the like elements throughout. The example embodiments are described below in order to explain the present invention by referring to the figures.

Figure 2:
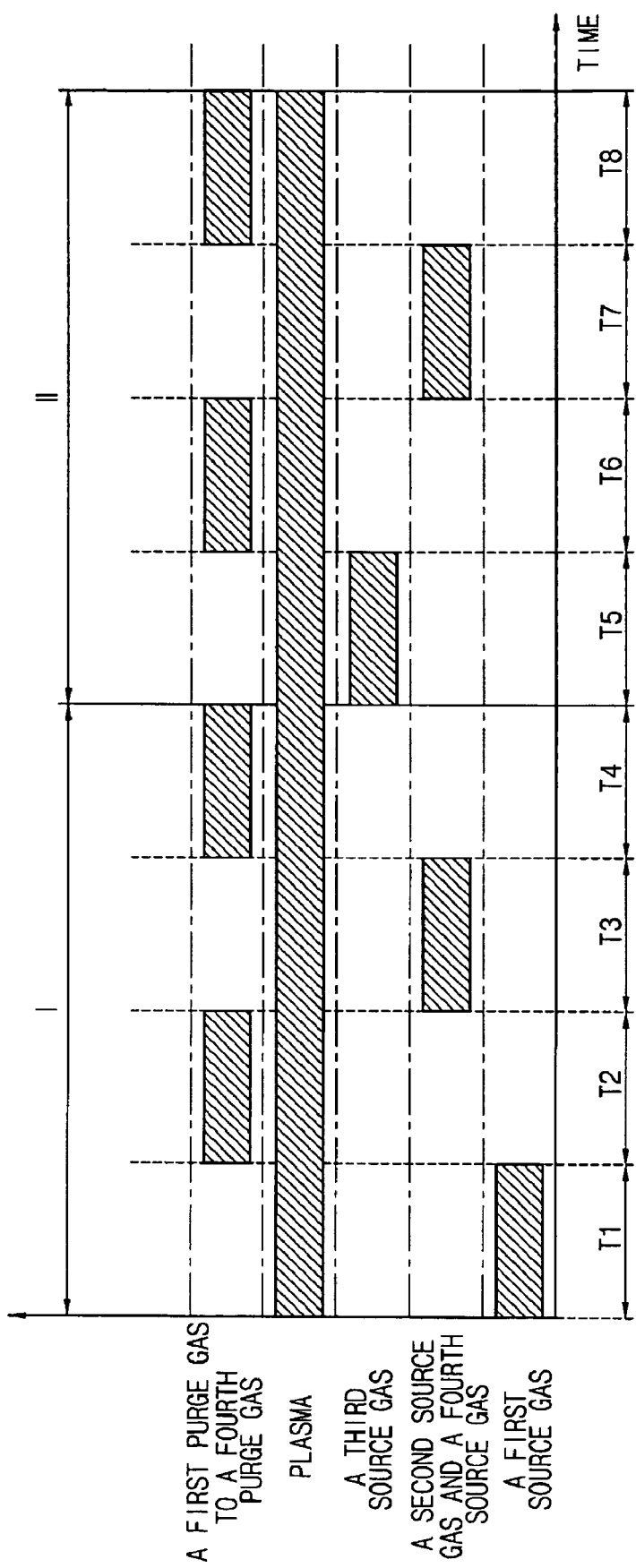
FIG. 2 is a timing diagram illustrating the method of forming the phase changeable material layer of FIG. 1, according to an example embodiment of the present invention.

FIG. 1 is a flow chart illustrating a method of forming a phase changeable material layer according to an example embodiment of the present invention, and FIG. 2 is a timing diagram illustrating timing of the method of forming the phase changeable material layer of FIG. 1, according to an example embodiment of the present invention. Referring to FIGS. 1 and 2, an object is loaded into a reaction chamber, and a plasma is formed in the reaction chamber at operation S10. The phase changeable material layer is formed on the object, which may be a silicon wafer, a silicon on insulator (SOI) substrate, or a single crystalline metal oxide substrate. For example, the object may be a single crystalline aluminum oxide ($Al_2O_3$) substrate or a single crystalline strontium titanium oxide ($SrTiO_3$) substrate. The object may include an electrode, a conductive layer, a conductive pattern, an insulation layer, an insulation pattern, etc. Here, the phase changeable material layer may be directly formed on the object or may be formed over the object by interposing the electrode, the conductive layer, the conductive pattern, the insulation layer, the insulation pattern, etc.

In an example embodiment of the present invention, the plasma formed in an upper portion of the reaction chamber may include a hydrogen ($H_2$) plasma. In order to generate the hydrogen plasma in the reaction chamber, a hydrogen gas may be introduced into the reaction chamber at a flow rate of about 30 to about 500 standard cubic centimeters per minute (sccm). For example, the hydrogen gas may be supplied into the reaction chamber at a flow rate of about 100 sccm.

In an example embodiment of the present invention, the plasma formed in the reaction chamber may further include an argon (Ar) plasma. An argon gas may be introduced into the reaction chamber at a flow rate of about 200 to about 800 sccm to thereby form the argon plasma in the reaction chamber. For example, the argon gas may be provided into the reaction chamber at a flow rate of about 300 sccm. Accordingly, a flow rate ratio of the hydrogen gas relative to the argon gas may be below about 1:9.

In the formation of the plasma in the reaction chamber, the hydrogen/argon gas introduced to the reaction chamber may be pre-heated for about 30 to about 90 seconds, and then the pre-heated hydrogen/argon gas may be stabilized for about 1 to about 3 seconds. For example, the hydrogen/argon gas may be pre-heated for about 60 seconds, and the pre-heated hydrogen/argon gas may then be stabilized for about 2 seconds. A power of about 20 to about 200 W may be applied to the stabilized hydrogen/argon gas for about 5 to about 15 seconds, thereby generating the hydrogen/argon plasma in the reaction chamber. For example, a power of about 100 W may be applied to the stabilized hydrogen/argon gas for about 10 seconds to generate the hydrogen/argon plasma. The method of FIGS. 1 and 2 may be referred as a plasma assisted chemical vapor deposition method, in which a plasma is continuously applied in the reaction chamber during the deposition of various layers.

The hydrogen/argon plasma may be continuously formed in the reaction chamber during the method of forming the phase changeable material layer on the object. A purge gas including an argon gas may be introduced into the reaction chamber after forming the hydrogen/argon plasma in the reaction chamber. The purge gas removes remaining hydrogen/argon gas from the reaction chamber. The purge gas may be provided into the reaction chamber for about 1 to about 3 seconds. For example, the purge gas may be introduced into the reaction chamber for about 2 seconds.

Referring now to FIGS. 1 and 2, in operation S20, a first source gas including a first material is fed into the reaction chamber and provided onto the object for a first time T1 after forming the hydrogen/argon plasma in the reaction chamber at operation S10. The first source gas may be provided onto the object from a first source gas canister together with a first carrier gas.

The first source gas canister may be kept at a room temperature. The first carrier gas may include an inactive gas such as an argon gas or a nitrogen gas. The first carrier gas may be provided into the reaction chamber at a flow rate of about 30 to about 500 sccm.

For example, the first carrier gas may be introduced into the reaction chamber at a flow rate of about 100 sccm. The first source gas including the first material is introduced into the reaction chamber for the first time T1, which is in a range of about 0.1 to about 2.0 seconds.

For example, the first source gas may be provided on the object for about 1.0 second. The first material of the first source gas may be chemically absorbed (i.e., chemisorbed) onto the object under a pressure of about 1 to about 5 Torr by applying a power of about 20 to about 200 W. For example, the first material is chemisorbed on the object under a pressure of about 3 Torr by applying a power of about 100 W.

Since the first material of the first source gas is chemisorbed on the object using the hydrogen/argon plasma, the first material may be chemisorbed on the object at a low temperature of about 100 to about 500° C. For example, the first material of the first source gas may be chemisorbed on the object at a temperature of about 200° C. Here, the reaction chamber may have a temperature of about 100 to about 200° C. For example, the reaction chamber may have a temperature of about 150° C. while chemisorbing the first material onto the object.

The first material of the first source gas may include germanium (Ge). For example, the first material may be one of the following: $Ge(iPro)_3H$, $GeCl_4$, $Ge(Me)_4$, $Ge(Me)_4N_3$, $Ge(Et)_4$, $Ge(Me)_3NEt_2$, $Sb(GeMe_3)_3$, $Ge(nBu)_4$, $Sb(GeEt_3)_3$, $Ge(Cp)_2$, $Ge(CH_2CHCH_2)_4$, etc. These can be used alone or in a mixture thereof. For example, the first material may include $Ge(iPro)_3H$. The following Table 1 shows types and characteristics of different materials that include germanium and may be used as the first material employed in example embodiments of the present invention.

TABLE 1

| Type | Melting Point [° C.] | Boiling Point [° C.] | Molecular Weight | Property |
|---|---|---|---|---|
| $GeCl_4$ | −49.5 | 83.1 | 214.40 | Sensitive to air/moisture |
| $Ge(Me)_4$ | −88.0 | 43.4 | 132.73 | Sensitive to air/moisture |
| $Ge(Me)_4N_3$ | −65.0 | 136.0 | 159.71 | Sensitive to air/moisture |
| $Ge(Et)_4$ | −90.0 | 165.0 | 188.84 | Sensitive to air/moisture |
| $Ge(Me)_3Net_2$ | <10.0 | 138.0 | 189.82 | Sensitive to air/moisture |
| $Sb(GeMe_3)_3$ | 12.0 | — | 474.83 | Sensitive to air/moisture |
| Ge(nBu)4 | −73.0 | 225.0 | 301.05 | Sensitive to air/moisture |
| $Sb(GeEt_3)_3$ | <10.0 | 157.0 | 683.71 | Sensitive to air/moisture |
| $Ge(Cp)_2$ | 25.0< | — | 202.78 | Yellow solid |
| $Ge(CH_2CHCH_2)_4$ | −80 | 105 | 236.88 | Sensitive to air/moisture |

When the first material of the first source gas includes germanium, the first material is chemically absorbed on the object so that a germanium layer that corresponds to a first material layer is formed on the object.

As illustrated in FIGS. 1 and 2, in operation S30, a first purge gas is then introduced into the reaction chamber for a second time T2 after forming the first material layer (i.e., the germanium layer) on the object. The first purge gas may be supplied into the reaction chamber for the second time T2, which may be in a range of about 0.1 to about 2.0 seconds. The first purge gas may include an inactive gas such as an argon gas or a nitrogen gas. For example, the first purge gas including the argon gas may be introduced into the reaction chamber for about 1.0 second.

Additionally, the first purge gas may be provided into the reaction chamber at a flow rate of about 30 to about 500 sccm. For example, the first purge gas may be introduced into the reaction chamber at a flow rate of about 100 sccm. The first purge gas removes an unchemisorbed first material from the reaction chamber. Particularly, the first purge gas removes a portion of the first material physically absorbed onto the object and/or the chemisorbed first material, and further removes a drifting portion of the first material in the reaction chamber.

In operation S40, a second source gas including a second material is fed into the reaction chamber and on the object for about a third time T3 after providing the first purge gas. The second source gas may be provided from a second source gas canister having a temperature of about 30 to about 40° C. The second source gas may be introduced on the first material layer formed on the object together with a second carrier gas. The second carrier gas may be introduced into the reaction chamber at a flow rate of about 30 to about 500 sccm. For example, the second carrier gas including an argon gas may be provided into the reaction chamber at a flow rate of about 100 sccm.

The second material of the second source gas may include tellurium (Te). For example, the second material may include one of the following: $Te(iBu)_2$, $TeCl_4$, $Te(Me)_2$, $Te(Et)_2$, $Te(nPr)_2$, $Te(iPr)_2$, $Te(tBu)_2$, etc. These can be used alone or in a mixture thereof as the second material. In particular, the second material may include $Te(iBu)_2$. TeCl4 has a melting point of about 224° C., a boiling point of about 380° C., and a molecular weight of about 269.41. $Te(Me)_2$ has a melting point of about −10° C. and a molecular weight of about 157.68. $Te(Et)_2$, $Te(nPr)_2$, $Te(iPr)_2$ and $Te(tBu)_2$ have molecular weights of about 185.72, about 213.77, about 213.77 and about 241.83, respectively.

The second source gas may be provided on the first material layer for the third time T3, which is in a range of about 0.1 to about 1.0 second. For example, the second source gas may be introduced into the reaction chamber for about 0.4 to about 0.8 seconds. The second material of the second source gas may chemically react with the first material layer at a low temperature of about 100 to about 500° C. and a pressure of about 1 to about 5 Torr. Accordingly, a first composite material layer including the first material and the second material is formed on the object in accordance with the reaction between the second material and the first material layer.

When the second material chemically reacts with the first material layer, a power of about 20 to about 200 W is applied to the reaction chamber. For example, the first composite material layer is formed by applying a power of about 100 W.

When the first material includes germanium and the second material contains tellurium, the first composite material layer includes germanium-tellurium by a chemical reaction between tellurium in the second material and germanium in the first material. That is, the first composite material layer including the first and the second materials corresponds to a germanium-tellurium layer.

The first time T1 (i.e., a first feeding time) of the first source gas and the third time T3 (i.e., a third feeding time) of the second source gas may be adjusted to easily control a concentration ratio between germanium and tellurium contained in the first composite material layer.

Figure 3:
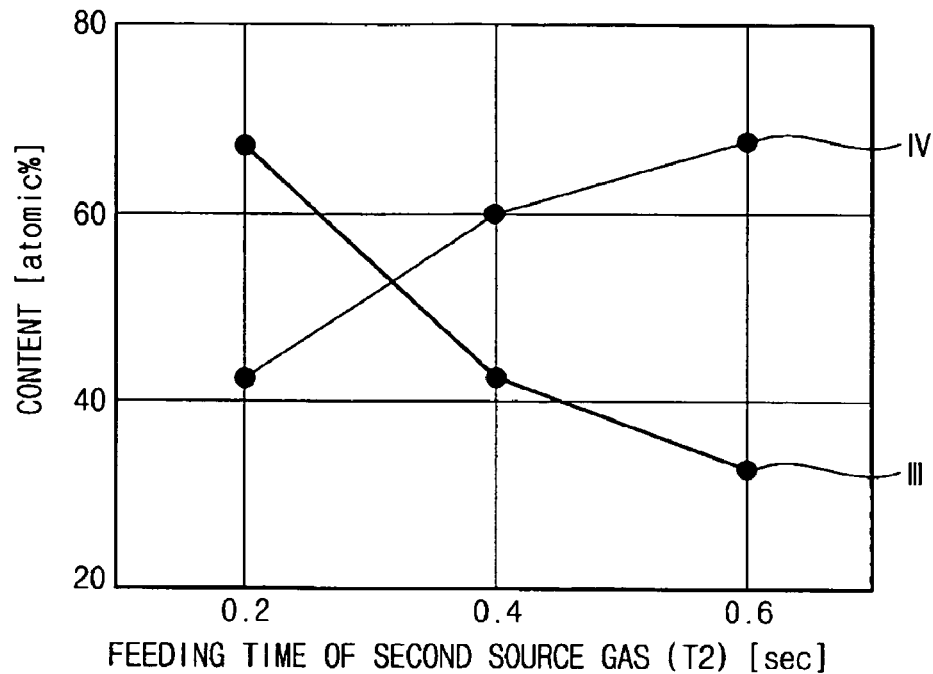
FIG. 3 is a graph illustrating concentrations of germanium and tellurium in a first composite material layer with respect to a first time T1 and a third time T3 of the timing diagram of FIG. 2, according to an example embodiment of the present invention.

FIG. 3 is a graph illustrating concentrations of germanium and tellurium in the first composite material layer with respect to the first time T1 and the third time T3 of the timing diagram of FIG. 2 according to an example embodiment of the present invention. In FIG. 3, "III" represents a concentration of germanium contained in the first composite material layer, and "IV" represents a concentration of tellurium included in the first composite material layer.

In the embodiment of FIG. 3, the flow rate of the hydrogen gas is set to about 100 sccm to form the hydrogen plasma in the reaction chamber, and the first time T1 of the first source gas including germanium is set to about 1.0 second at a temperature of about 200° C.

As illustrated in FIG. 3, as the third time T3 of the second source gas including tellurium increases from about 0.2 seconds to about 0.6 seconds, the concentration of tellurium IV in the first composite material layer increases whereas the concentration of germanium III in the first composite material layer decreases.

When the first time T1 of the first source gas including germanium and/or the third time T3 of the second source gas including tellurium are changed, a concentration ratio between germanium and tellurium in the first composite material layer may be easily controlled.

Additionally, the concentrations of germanium and tellurium in the first composite material layer may be adjusted by the flow rate of the hydrogen gas introduced to form the hydrogen plasma.

Figure 4:
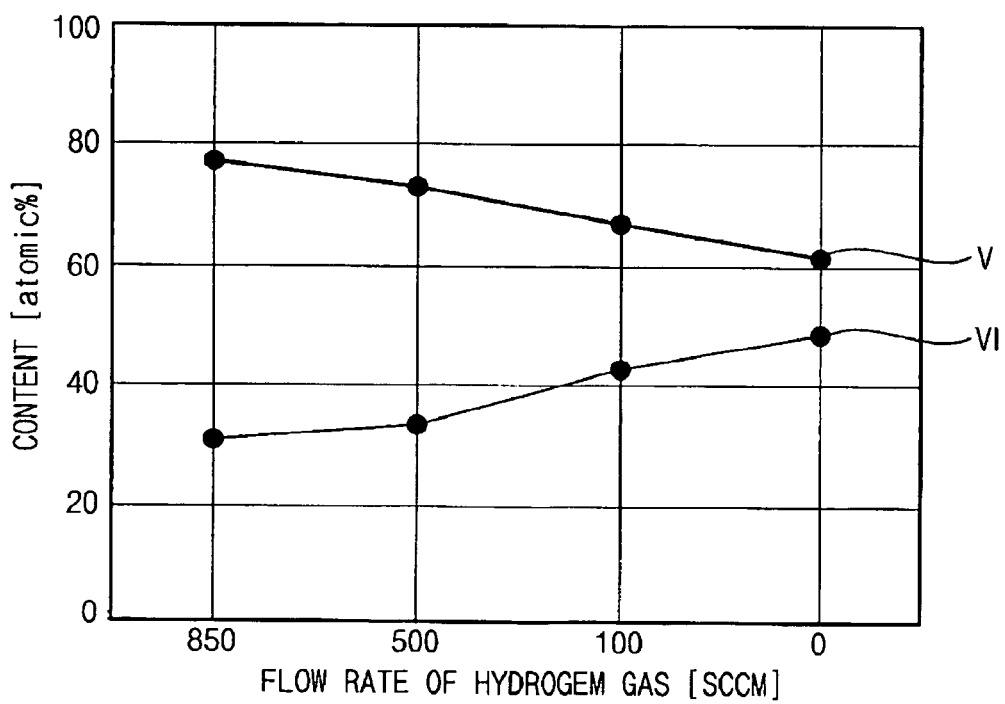
FIG. 4 is a graph illustrating concentrations of germanium and tellurium in a first composite material layer relative to a flow rate of hydrogen gas, according to an example embodiment of the present invention.

FIG. 4 is a graph illustrating the concentrations of germanium and tellurium in the first composite material layer relative to the flow rate of the hydrogen gas, according to an embodiment of the present general inventive concept. In FIG. 4, "V" represents the concentration of germanium contained in the first composite material layer, and "VI" indicates the concentration of tellurium included in the first composite material layer. As illustrated in FIG. 4, when the flow rate of the hydrogen gas is about 850 sccm, the concentration of germanium V is at least two times greater than the concentration of tellurium VI. When the flow rate of the hydrogen gas is reduced from about 850 sccm to about 0 sccm, the concentration of germanium V is substantially to the same as the concentration of tellurium VI.

Accordingly, the concentrations of germanium and tellurium in the first composite material layer may be easily adjusted by controlling the flow rate of the hydrogen gas for forming the hydrogen plasma.

Referring back to FIGS. 1 and 2, in operation S50, a second purge gas is introduced into the reaction chamber for a fourth time T4 after forming the first composite material layer on the object. The second purge gas may be provided into the reaction chamber for the fourth time T4, which may be in a range of about 0.1 to about 2.0 seconds. For example, the second purge gas including an argon gas may be introduced into the reaction chamber for about 1.0 second. The second purge gas may be introduced into the reaction chamber at a flow rate of about 30 to about 500 sccm. For example, the second purge gas may be provided into the reaction chamber at a flow rate of about 100 sccm.

The second purge gas removes unreacted second material from the reaction chamber. In particular, the second purge gas removes a portion of the second material that is not chemically reacted with the first material layer.

In operation S60, a third source gas including a third material is provided into the reaction chamber for a fifth time T5 after introducing the second purge gas into the reaction chamber. The third source gas is fed into the reaction chamber and is provided on the first composite material layer from a third source gas canister together with a third carrier gas. The third source gas canister may have a temperature of about 30 to about 50° C. The third carrier gas may include an inactive gas such as an argon gas or a nitrogen gas. The third carrier gas may be introduced into the reaction chamber at a flow rate of about 30 to about 500 sccm. For example, the third carrier gas is provided into the reaction chamber at a flow rate of about 100 sccm.

The third source gas may be provided onto the first composite material layer for the fifth time T5, which may be in a range of about 0.1 to about 20 seconds, thereby forming a third material layer on the first composite material layer. For example, the third source gas may be introduced into the reaction chamber for about 0.4 to about 0.8 seconds. Additionally, the third material layer may be formed on the first composite material layer under a pressure of about 1 to about 5 Torr by applying a power of about 20 to about 200 W. For example, the third material layer is formed on the first composite material layer under a pressure of about 3 Torr by applying a power of about 100 W.

As described above, since the third material layer including the third material is formed on the first composite material layer using the hydrogen/argon plasma, the third material layer may be formed at a low temperature of about 100 to about 500° C. For example, the third material layer may be formed on the first composite material layer at a temperature of about 200° C. Here, the reaction chamber may have a temperature of about 100 to about 200° C. For example, an inside of the reaction chamber may have a temperature of about 150° C.

The third material of the third source gas may include antimony (Sb). For example, the third material of the third source gas may include one of the following: $Sb(iBu)_3$, $SbCl_3$, $SbCl_5$, $Sb(Me)_3$, $Sb(Et)_3$, $Sb(nPr)_3$, $Sb(tBu)_3$, $Sb[N(Me)_2]_3$, $Sb(Cp)_3$, etc. These can be used alone or in a mixture thereof as the third material. In particular, the third material may include $Sb(iBu)_3$. The following Table 2 shows types and characteristics of different materials that include antimony and may be used as the third material in the present embodiment.

TABLE 2

| Type | Melting Point [° C.] | Boiling Point [° C.] | Molecular Weight | Property |
|---|---|---|---|---|
| $SbCl_3$ | 73.4 | 283.0 | 228.11 | — |
| $SbCl_5$ | 2.8 | 79.0 | 299.02 | — |
| $Sb(Me)_3$ | −87.6 | 80.6 | 166.86 | Pyrophoric |
| $Sb(Et)_3$ | — | 156.0 | 208.94 | Pyrophoric |
| $Sb(nPr)_3$ | — | 100.0 | 251.02 | Pyrophoric |
| $Sb(tBu)_3$ | <10.0 | 102.0 | 293.10 | Sensitive to air/moisture |
| $Sb[N(Me)_2]_3$ | — | 32.0 | 253.99 | Sensitive to air/moisture |
| $Sb(Cp)_3$ | 56.0 | — | — | Sensitive to air/moisture |

When the third material of the third source gas includes antimony, the third material layer formed on the first composite material layer corresponds to an antimony layer.

As illustrated in FIGS. 1 and 2, in operation S70, a third purge gas is introduced into the reaction chamber for a sixth time T6 after forming the third material layer on the first composite material layer. The third purge gas may be provided into the reaction chamber for the sixth time T6, which may be in a range of about 0.1 to about 2.0 seconds. For example, the third purge gas including an argon gas may be introduced into the reaction chamber for about 1.0 second. The third purge gas may be provided into the reaction chamber at a flow rate of about 30 to about 500 sccm. For example, the third purge gas may be introduced into the reaction chamber at a flow rate of about 100 sccm. The third purge gas removes unreacted third material from the reaction chamber. That is, the third purge gas purges a portion of the third material that is not chemically reacted with the first composite material layer.

In operation S80, a fourth source gas including a fourth material is fed into the reaction chamber and is provided on the third material layer for a seventh time T7 after purging the reaction chamber using the third purge gas. The fourth material of the fourth source gas may include tellurium. For example, the fourth material may include one of the following: $Te(iBu)_2$, $TeCl_4$, $Te(Me)_2$, $Te(Et)_2$, $Te(nPr)_2$, $Te(iPr)_2$, $Te(tBu)_2$, etc. These can be used alone or in a mixture thereof as the fourth material. In particular, the fourth material may include $Te(iBu)_2$. The fourth source gas may be provided from a fourth source gas canister having a temperature of about 30 to about 40° C. The second and the fourth source gases may be provided from one source gas canister.

The fourth source gas may be fed into the reaction chamber and provided on the third material layer together with a fourth carrier gas. The fourth carrier gas may be introduced into the reaction chamber at a flow rate of about 30 to about 500 sccm. For example, the fourth carrier gas including an argon gas may be introduced into the reaction chamber at a flow rate of about 100 sccm.

The fourth source gas may be fed into the reaction chamber and provided onto the third material layer for the seventh time T7 in a range of about 0.1 to about 1.0 second. For example, the fourth source gas including the fourth material may be introduced into the reaction chamber for about 0.4 to about 0.8 seconds. As the fourth material chemically reacts with the third material layer at a low temperature of about 100 to about 500° C. and a pressure of about 1 to about 5 Torr, a second composite material layer including the third and the fourth materials is formed on the first composite material layer. That is, the fourth material reacts with the third material to form the second composite material layer. In formation of the second composite material layer, a power of about 20 to about 200 W may be applied to the reaction chamber. For example, the second composite material layer may be formed on the first composite material layer by applying a power of about 100 W.

When the third material includes antimony and the fourth material includes tellurium, the second composite material layer includes antimony-tellurium in accordance with a chemical reaction between antimony of the third source gas and tellurium of the fourth source gas. More specifically, the second composite material layer corresponds to an antimony-tellurium layer. As a result, the phase changeable material layer including germanium-antimony-tellurium is formed on the object.

Concentrations of antimony and tellurium in the second composite material layer may be easily adjusted by controlling the fifth time T5 of the third source gas and the seventh time T7 of the fourth source gas.

Figure 5:
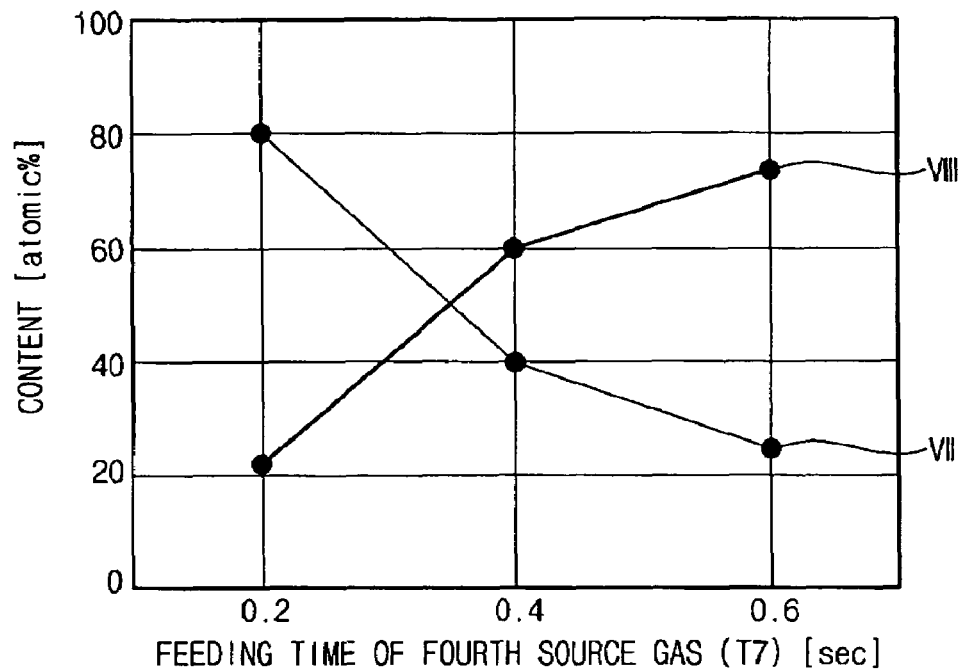
FIG. 5 is a graph illustrating concentrations of antimony and tellurium contained in a second composite material layer with respect to a fifth time T5 and a seventh time T7 of the timing diagram of FIG. 2, according to an example embodiment of the present invention.

FIG. 5 is a graph illustrating the concentrations of antimony and tellurium contained in the second composite material layer with respect to a fifth time T5 and a seventh time T7 of the timing diagram of FIG. 2, according to an embodiment of the present general inventive concept. In FIG. 5, "VII" represents the concentration of antimony included in the second composite material layer, and "VIII" represents the concentration of tellurium contained in the second composite material layer.

In the present embodiment, the flow rate of the hydrogen gas is about 100 sccm to form the hydrogen plasma in the reaction chamber, and the fifth time T5 of the third source gas including antimony is constantly maintained at about 0.4 seconds at a temperature of about 200° C.

Referring to FIG. 5, as the seventh time T7 of the fourth source gas including tellurium increases from about 0.2 seconds to about 0.6 seconds, the concentration of tellurium VIII in the second composite material layer increases whereas the concentration of antimony VII in the second composite material layer decreases. When the fifth time T5 of the third source gas including antimony and/or the seventh time T7 of the fourth source gas including tellurium are varied, a concentration ratio between antimony and tellurium in the second composite material layer may be easily controlled.

Additionally, the concentrations of antimony and tellurium in the second composite material layer may be adjusted by the flow rate of the hydrogen gas introduced to form the hydrogen plasma in the reaction chamber.

Figure 6:
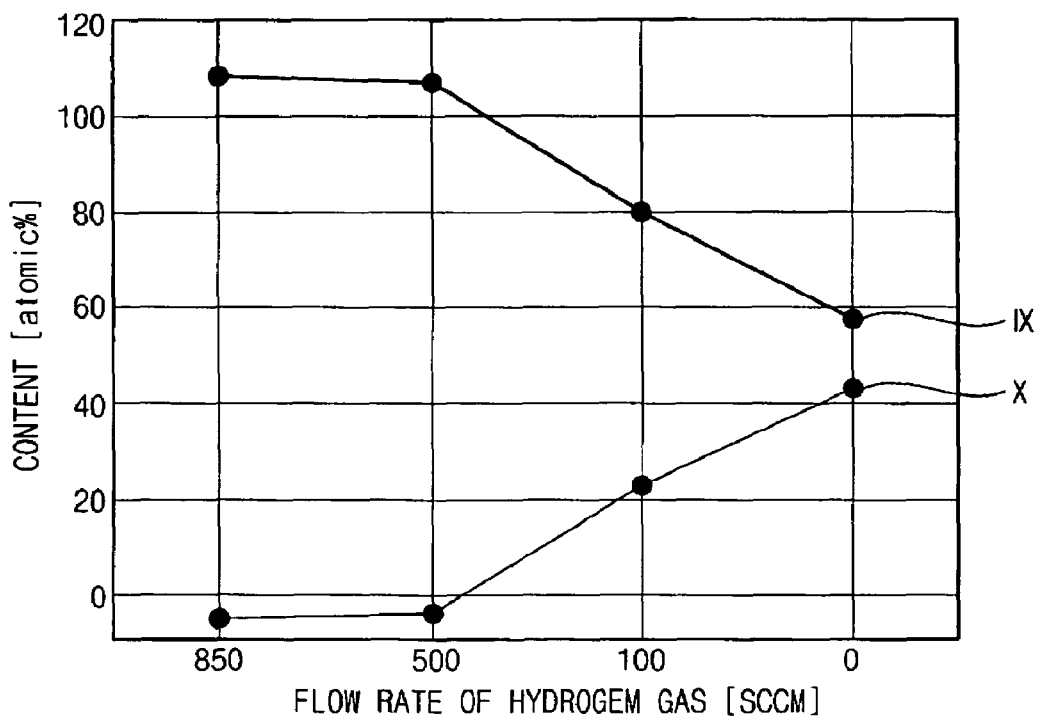
FIG. 6 is a graph illustrating concentrations of antimony and tellurium in a second composite material layer relative to a flow rate of hydrogen gas, according to an example embodiment of the present invention.

FIG. 6 is a graph illustrating the concentrations of antimony and tellurium in the second composite material layer relative to the flow rate of the hydrogen gas, according to an example embodiment of the present invention. As illustrated in FIG. 6, when the flow rate of the hydrogen gas exceeds about 500 sccm, the second composite material layer predominantly includes antimony without much tellurium. When the flow rate of the hydrogen gas is below about 100 sccm, the concentration of antimony IX rapidly decreases whereas the concentration of tellurium X greatly increases. Therefore, the concentrations of antimony and tellurium in the second composite material layer may be easily adjusted by controlling the flow rate of the hydrogen gas to form the hydrogen plasma.

The first composite material layer and the second composite material layer may alternately be deposited on the substrate while maintaining the plasma source at a constant. Additionally, the first and second composite material layers may not be physically identifiable. When the first material is germanium, the second material is tellurium, the third material is antimony, and the fourth material is tellurium, the first composite material layer is a germanium-tellurium material (Ge—Te) and the second composite material layer is an antimony-tellurium material (Sb—Te). In other words, the germanium and the antimony both react with the tellurium, and the first and second composite material layers may form a homogenous GeSbTe layer. This process is represented by the following equation 1.

$$GeTe + SbTe \rightarrow GeSbTe \qquad \text{Equation 1}$$

Figure 7:
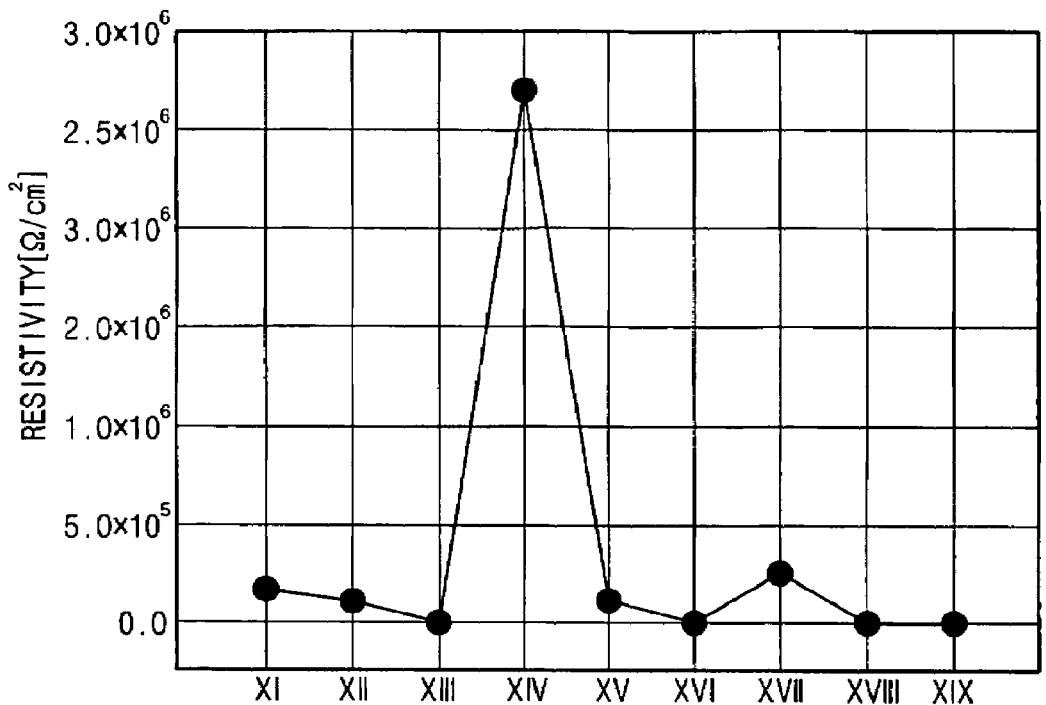
FIG. 7 is a graph illustrating sheet resistances of phase changeable material layers relative to feeding times of source gasses including germanium, antimony, and tellurium, according to an example embodiment of the present invention.

FIG. 7 is a graph illustrating sheet resistances of phase changeable material layers relative to feeding times of the source gases including germanium, antimony, and tellurium, according to an example embodiment of the present invention. In FIG. 7, "XI" represents a first sheet resistance of a first phase changeable material layer formed by providing (i.e., by feeding into the reaction chamber) the first source gas for about 1.0 second, the second source gas for about 0.2 seconds, the third source gas for about 0.4 seconds, and the fourth source gas for about 0.2 seconds. "XII" represents a second sheet resistance of a second phase changeable material layer formed by providing the first source gas for about 1.0 second, the second source gas for about 0.3 seconds, the third source gas for about 0.4 seconds, and the fourth source gas for about 0.3 seconds. "XIII" represents a third sheet resistance of a third phase changeable material layer formed by providing the first source gas for about 1.0 second, the second source gas for about 0.4 seconds, the third source gas for about 0.4 seconds, and the fourth source gas for about 0.4 seconds. "XIV" represents a fourth sheet resistance of a fourth phase changeable material layer formed by providing the first source gas for about 1.0 second, the second source gas for about 0.2 seconds, the third source gas for about 0.6 seconds, and the fourth source gas for about 0.2 seconds. "XV" represents a fifth sheet resistance of a fifth phase changeable material layer formed by providing the first source gas for about 1.0 second, the second source gas for about 0.3 seconds, the third source gas for about 0.6 seconds, and the fourth source gas for about 0.3 seconds. "XVI" represents a sixth sheet resistance of a sixth phase changeable material layer formed by providing the first source gas for about 1.0 second, the second source gas for about 0.4 seconds, the third source gas for about 0.6 seconds, and the fourth source gas for about 0.4 seconds. "XVII" represents a seventh sheet resistance of a seventh phase changeable material layer formed by providing the first source gas for about 1.0 second, the second source gas for about 0.2 seconds, the third source gas for about 0.8 seconds, and the fourth source gas for about 0.2 seconds. "XVIII" represents an eighth sheet resistance of an eighth phase changeable material layer formed by providing the first source gas for about 1.0 second, the second source gas for about 0.3 seconds, the third source gas for about 0.8 seconds, and the fourth source gas for about 0.3 seconds. "XIX" represents a ninth sheet resistance of a ninth phase changeable material layer formed by providing the first source gas for about 1.0 second, the second source gas for about 0.4 seconds, the third source gas for about 0.8 seconds, and the fourth source gas for about 0.4 seconds.

Referring to FIG. 7, the third sheet resistance of the third phase changeable material layer XIII is about 1,219 $\Omega/cm^2$, and the sixth sheet resistance of the sixth phase changeable material layer XVI is about 1,725 $\Omega/cm^2$. Additionally, the eighth sheet resistance of the eighth phase changeable material layer XVIII is about 2,084 $\Omega/cm^2$, and the ninth sheet resistance of the ninth phase changeable material layer XIX is about 826 $\Omega/cm^2$.

However, the first sheet resistance of the first phase changeable material layer XI is about 150,000 $\Omega/cm^2$, and the second sheet resistance of the second phase changeable material layer XII is about 99,572 $\Omega/cm^2$. The fourth sheet resistance of the fourth phase changeable material layer XIV is about $2.67 \times 10^6$ $\Omega/cm^2$, and the fifth sheet resistance of the fifth phase changeable material layer XV is about 103,510 $\Omega/cm^2$.

Further, the seventh sheet resistance of the seventh phase changeable material layer XVII is about 229,000 $\Omega/cm^2$. Therefore, the phase changeable material layer may have an appropriate sheet resistance when the phase changeable material layer is formed by providing the third source gas for the fifth time T5 in a range of about 0.6 to about 0.8 seconds, by providing the second source gas for the third time T3 in a range of about 0.4 to about 0.8 seconds, and by providing the fourth source gas for the seventh time T7 in a range of about 0.4 to about 0.8 seconds.

Typically, a higher resistivity in the phase changeable material layer allows the phase changeable material layer to be changed to an amorphous state using a low power and less current. The reduction in current may be seen from an application of the following equations 2 and 3:

$$P = I^2 R \qquad \text{Equation 2:}$$

$$I \propto 1/\sqrt{R} \qquad \text{Equation 3:}$$

where R represents the resistivity and sheet resistance times thickness is the resistivity and R includes $R_{GST}$ and $R_{BE}$(bottom electrode), P represents power required to change the phase changeable material to the amorphous state, and I represents a current that is dissipated in the phase changeable material layer when the power P is applied. Equation 3 is derived from Equation 2, and it can be seen that the amount of current I dissipated in the phase changeable material layer is inversely proportional to the square root of the resistivity R. However, if the resistivity of the phase changeable material layer is too high, the phase changeable material layer may heat up too much, and/or it may be difficult to change the phase changeable material layer to a crystalline state. As can be seen from FIG. 7, the feeding times of the first, second, third, and fourth source gases may be varied to produce the phase changeable material layers to have varying sheet resistances according to design specifications. Additionally, a flow amount of the first, second, third, and fourth materials is a function of the flow rates and the feeding times of the first, second, third, and fourth source gases, respectively. That is, flow amount=flow rate×feeding time. In the examples and illustrations throughout this description, the flow rates of the first, second, third, and fourth gases are assumed to be maintained at a constant for illustration purposes. However, the flow rates of the source gases may be varied, and in this case, the flow amounts of the first, the second, the third, and the fourth gases may be varied to obtain different characteristics in the phase changeable material layers. Thus, although this description refers to varying feeding times, it should be understood that flow amounts can be varied instead by varying the feeding times and/or the flow rates.

Referring back to FIGS. 1 and 2, in operation S90, a fourth purge gas is introduced into the reaction chamber for an eighth time T8 after forming the phase changeable material layer on the object. The fourth purge gas may be introduced into the reaction chamber for the eighth time T8, which may be in a range of about 0.1 to about 2.0 seconds. For example, the fourth purge gas including an argon gas may be provided into the reaction chamber for about 1.0 second. The fourth purge gas may be introduced into the reaction chamber at a flow rate of about 30 to about 500 sccm. For example, the fourth purge gas may be provided into the reaction chamber at a flow rate of about 100 sccm.

The fourth purge gas removes unreacted fourth material from the reaction chamber. In particular, the fourth gas purges a portion of the fourth material that is not chemically reacted with the third material layer. Electrical characteristics of the phase changeable material layer such as the sheet resistance may be controlled in accordance with the first time T1 of the first source gas, the third time T3 of the second source gas, the fifth time T5 of the third source gas, and the seventh time T7 of the fourth source gas.

Figure 8:
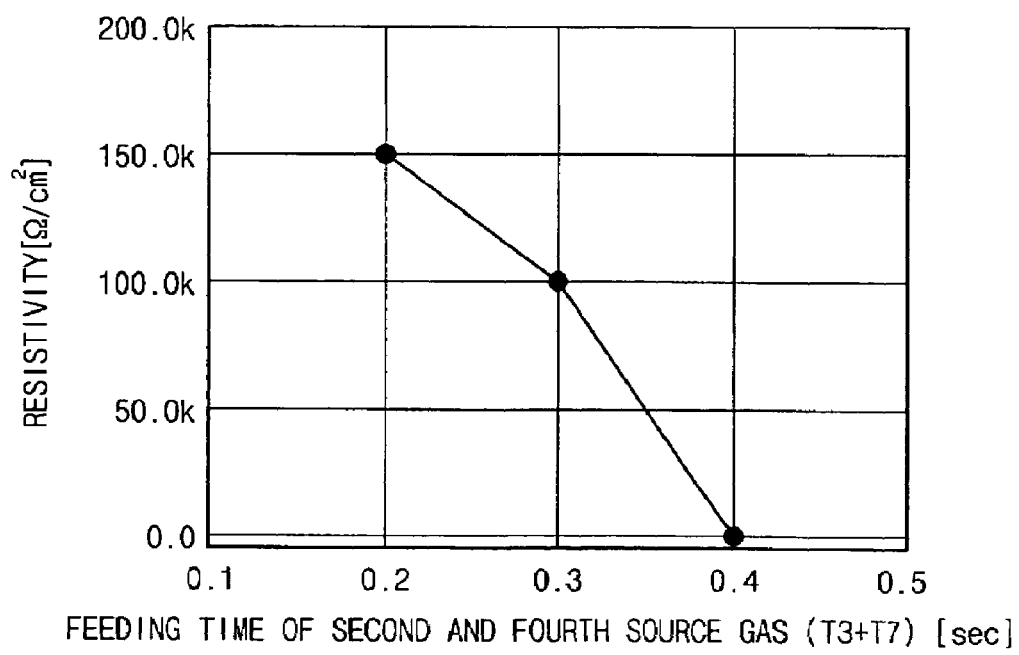
FIG. 8 is a graph illustrating sheet resistances of phase changeable material layers with respect to feeding times of source gasses including germanium, antimony, and tellurium, according to an example embodiment of the present invention.

FIG. 8 is a graph illustrating sheet resistances of phase changeable material layers with respect to feeding times of the source gases including germanium, antimony, and tellurium, according to an example embodiment of the present invention. In the embodiment of FIG. 8, the first time T1 of the first source gas and the fifth time T5 of the third source gas are set to about 1.0 second and about 0.4 seconds, respectively. The first, the second, the third and the fourth source gases are provided at a temperature of about 200° C. As illustrated in FIG. 8, when a sum of the third time T3 of the second source gas and the seventh time T7 of the fourth source gas is increased from 0.2 seconds to about 0.4 seconds, the sheet resistances of the phase changeable material layers are rapidly reduced from about 150 k $\Omega/cm^2$ to about 1,219 $\Omega/cm^2$.

Therefore, the electrical characteristics of the phase changeable material layers may be easily controlled by adjusting the first time T1 of the first source gas, by adjusting the third time T3 of the second source gas, by adjusting the fifth time T5 of the third source gas, and by adjusting the seventh time T7 of the fourth source gas.

Figure 9:
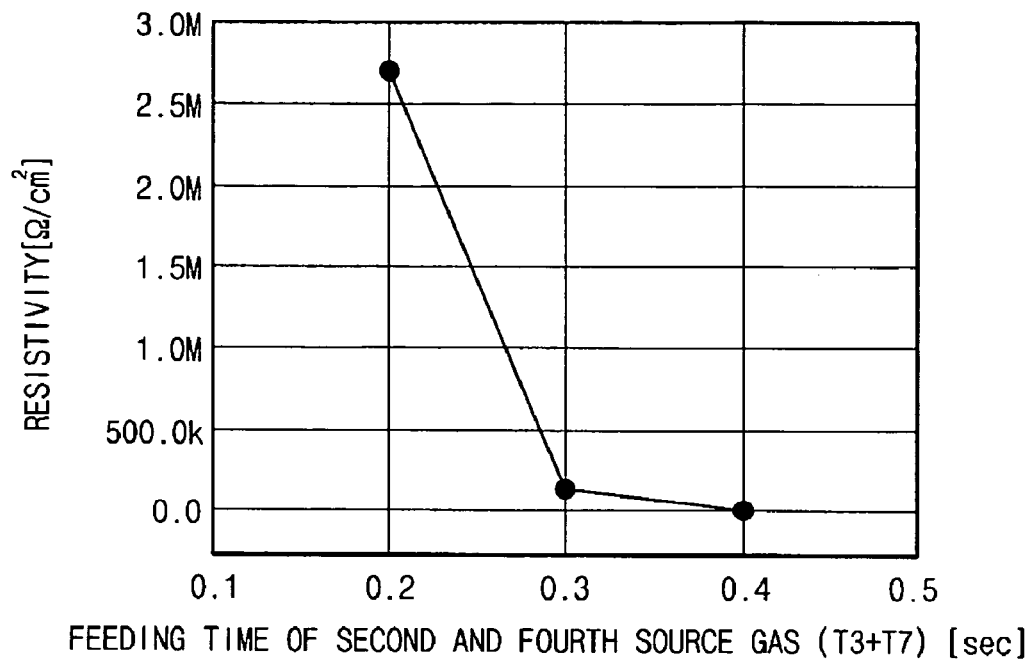
FIG. 9 is a graph illustrating sheet resistances of phase changeable material layers with respect to feeding times of source gasses including germanium, antimony, and tellurium, according to an example embodiment of the present invention.

FIG. 9 is a graph illustrating sheet resistances of phase changeable material layers with respect to feeding times of the source gases including germanium, antimony, and tellurium, according to an example embodiment of the present invention. In the embodiment of FIG. 9, the first time T1 of the first source gas and the fifth time T5 of the third source gas are set to about 1.0 second and about 0.6 seconds, respectively. The first, the second, the third and the fourth source gases are provided at a temperature of about 200° C. Referring to FIG. 9, when a sum of the third time T3 of the second source gas and the seventh time T7 of the fourth source gas is increased from 0.2 seconds to about 0.4 seconds, the sheet resistances of the phase changeable material layers are rapidly reduced from about 2.5 M $\Omega$/cm$^2$ to about 1,715 k$\Omega$/cm$^2$.

As described above, the electrical characteristics of the phase changeable material layers may be easily controlled by adjusting the first time T1 of the first source gas, by adjusting the third time T3 of the second source gas, by adjusting the fifth time T5 of the third source gas, and by adjusting the seventh time T7 of the fourth source gas.

Additionally, the concentrations of the first to the fourth materials in the phase changeable material layer may be adjusted in accordance with the feeding times of the first to the fourth source gases. For example, when the phase changeable material layer includes germanium-antimony-tellurium, the concentrations of germanium, antimony, and tellurium are adjusted by varying the feeding time of the first source gas including germanium, the feeding times of the second and the fourth source gas including tellurium, and the feeding time of the third source gas including antimony. Although the first material, the second material, the third material, and the fourth material are described herein as being germanium, tellurium, antimony, and tellurium, respectively, it should be understood that this description is for illustration purposes, and is not intended to limit the scope of the present general inventive concept. In fact, the materials containing germanium, antimony, and tellurium may be applied in other orders and/or sequences. For example, a material containing antimony may be applied first, a material containing tellurium second, a material containing germanium third, the material containing tellurium fourth. Other orders may also be used.

Figure 10:
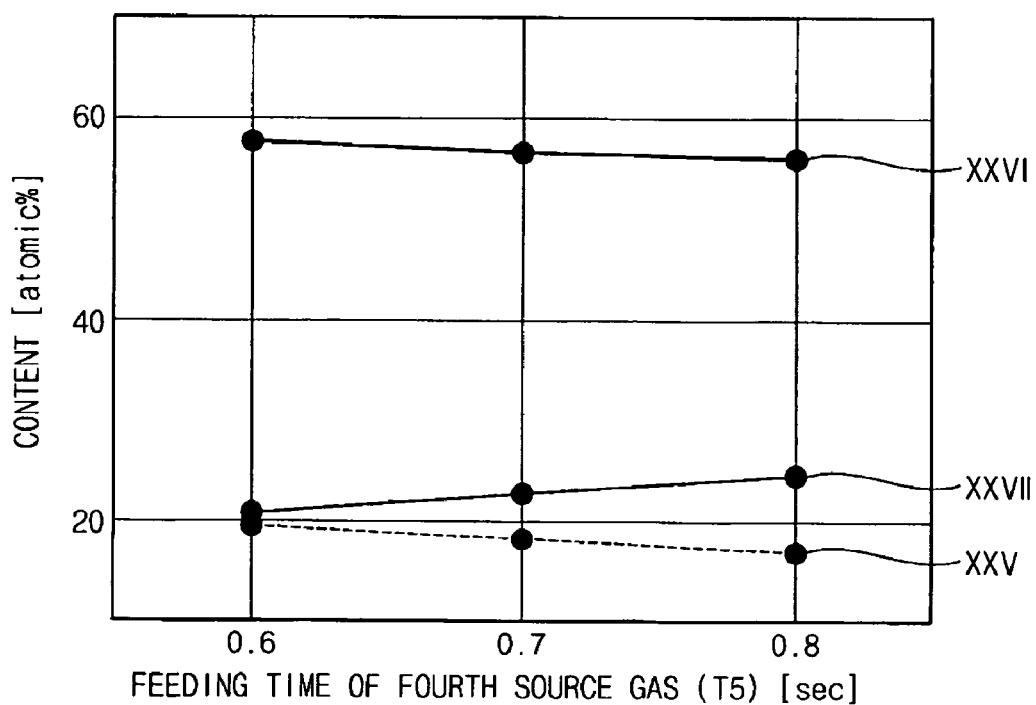
FIG. 10 is a graph illustrating concentrations of germanium, antimony, and tellurium in a phase changeable material layer relative to a feeding time of a third source gas, according to an example embodiment of the present invention.

FIG. 10 is a graph illustrating concentrations of germanium, antimony, and tellurium in a phase changeable material layer relative to a feeding time of a third source gas, according to an example embodiment of the present general inventive concept. In FIG. 10, "XXV", "XXVI" and "XXVII" represent the concentration of germanium, the concentration of tellurium, and the concentration of antimony, respectively. As illustrated in FIG. 10, when the fifth time T5 of the third source gas is increased from about 0.6 seconds to about 0.8 seconds, the concentration of germanium XXV and the concentration of tellurium XXVI are gradually reduced whereas the concentration of antimony XXVII is generally increased.

Accordingly, the phase changeable material layer may be formed to have desired concentrations of germanium, antimony, and tellurium by properly controlling the feeding times of the first to the fourth source gases.

Figure 11:
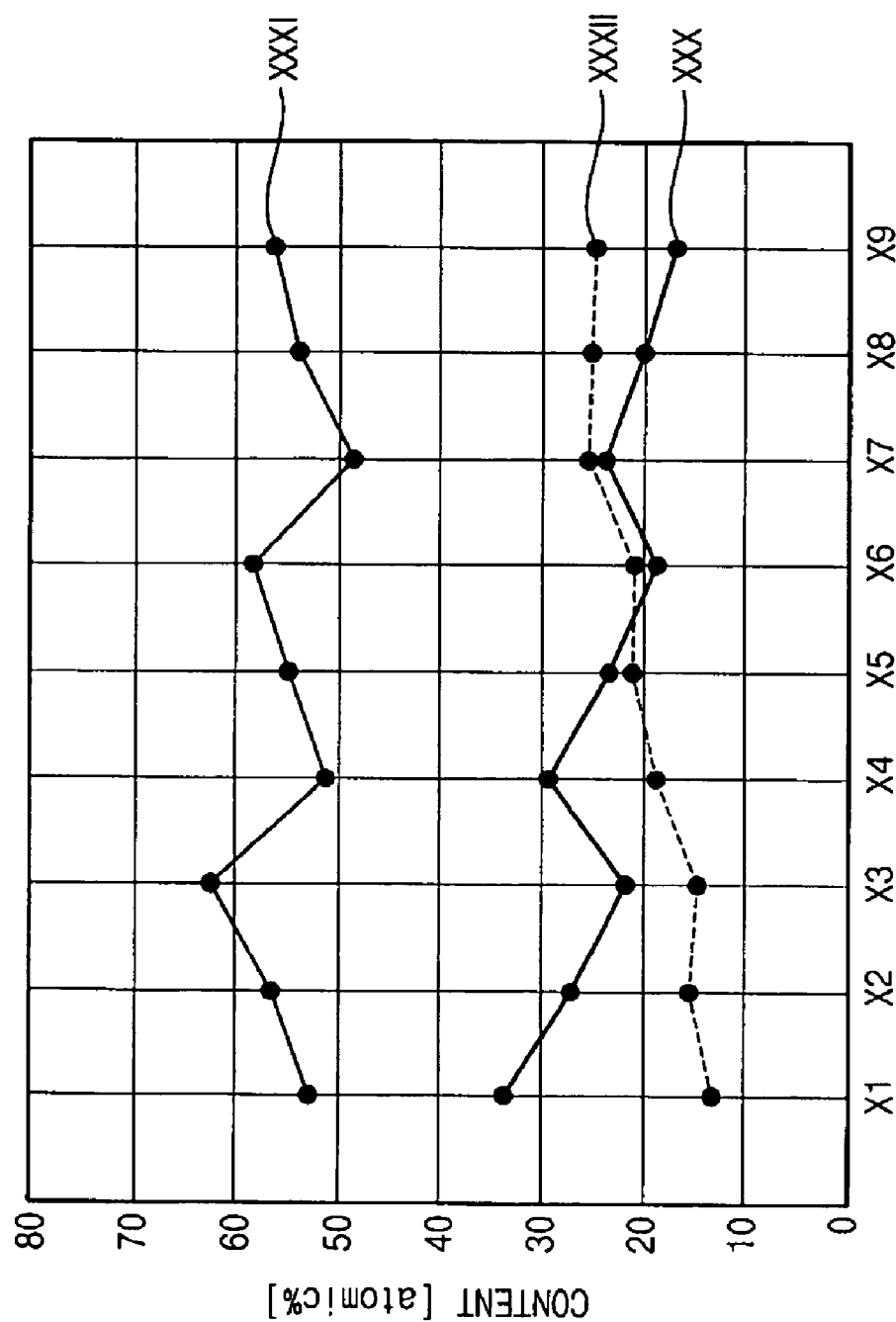
FIG. 11 is a graph illustrating concentration ratios of germanium, antimony and tellurium in phase changeable material layers relative to feeding times of source gases, according to an example embodiment of the present invention.

FIG. 11 is a graph illustrating concentration ratios of germanium, antimony, and tellurium in phase changeable material layers relative to feeding times of the source gases, according to an example embodiment of the present invention. In FIG. 11, "X1" represents a first concentration ratio of a first phase changeable material layer formed by providing a source gas including antimony for about 0.4 seconds and by providing a source gas including tellurium for about 0.2 seconds. "X2" represents a second concentration ratio of a second phase changeable material layer formed by providing a source gas including antimony for about 0.4 seconds and by providing a source gas including tellurium for about 0.3 seconds. "X3" represents a third concentration ratio of a third phase changeable material layer formed by providing a source gas including antimony for about 0.4 seconds and by providing a source gas including tellurium for about 0.4 seconds. "X4" represents a fourth concentration ratio of a fourth phase changeable material layer formed by providing a source gas including antimony for about 0.6 seconds and by providing a source gas including tellurium for about 0.2 seconds. "X5" represents a fifth concentration ratio of a fifth phase changeable material layer formed by providing a source gas including antimony for about 0.6 seconds and by providing a source gas including tellurium for about 0.3 seconds. "X6" represents a sixth concentration ratio of a sixth phase changeable material layer formed by providing a source gas including antimony for about 0.6 seconds and by providing a source gas including tellurium for about 0.4 seconds. "X7" represents a seventh concentration ratio of a seventh phase changeable material layer formed by providing a source gas including antimony for about 0.8 seconds and by providing a source gas including tellurium for about 0.2 seconds. "X8" represents an eighth concentration ratio of an eighth phase changeable material layer formed by providing a source gas including antimony for about 0.8 seconds and by providing a source gas including tellurium for about 0.3 seconds. "X9" represents a ninth concentration ratio of a ninth phase changeable material layer formed by providing a source gas including antimony for about 0.8 seconds and by providing a source gas including tellurium for about 0.4 seconds. In the embodiment of FIG. 11, the feeding time of a source gas including germanium is constantly maintained at about 1.0 second.

Referring to FIG. 11, the phase changeable material layers include germanium of about 10 to about 35 atomic weight percent, antimony of about 10 to about 25 atomic weight percent, and tellurium of about 45 to about 65 atomic weight percent. Accordingly, the concentration ratios among germanium, antimony and tellurium in the phase changeable material layers may be about 0.35-0.65: about 0.35-0.65: about 0.85-1.65.

When the feeding time of the source gas including antimony is about 0.6 to about 0.8 seconds and the feeding time of the source gas including tellurium is about 0.6 to about 0.8 seconds, the concentration ratio among germanium, antimony and tellurium in the phase changeable material layer may be about 2:2:5. When the phase changeable material layer has the concentration ratio among germanium, antimony, and tellurium of about 2:2:5, a phase transition of the phase changeable material layer between the amorphous state and the crystalline state (or vice versa) may efficiently occur.

According to the various embodiments of the present general inventive concept, the phase changeable material layer may have a desired concentration ratio among germanium, antimony, and tellurium by controlling the feeding times of the source gases including germanium, antimony, and tellurium.

As described above, the phase changeable material layer including the first and the second composite material layers is formed on the object using the method described with reference to FIGS. 1 and 2. As illustrated in FIG. 2, the phase changeable material layer may have a desired thickness and a desired adjusted concentration ratio by repeating a first unit process I to form the first composite material layer and a second unit process II to form the second composite material layer. For example, when the first unit process I and the second unit process II are alternately repeated about fifty times, the phase changeable material layer may have a thickness of about 1,000 Å.

The first unit process I and the second unit process II may be alternately repeated. Alternatively, more than one first unit process I and/or more than one second unit process II may be alternately repeated. For example, the first unit process I, the second unit process II, the first unit process I, and the second unit process II may be sequentially executed. Alternatively, the first unit process I, the first unit process I, the second unit process II, the first unit process I, the first unit process and the second unit process II may be successively carried out. Further, the second unit process II, the first unit process I, the second unit process II, and the first unit process I may be performed in order. Furthermore, the second unit process II, the second unit process II, the first unit process I, the second unit process II, the second unit process II, and the first unit process may be sequentially executed. Other sequences of the first and second unit processes I and II may also be performed.

According to the various embodiments of the present general inventive concept, the phase changeable material layer may have a crystalline structure that is different from that of the conventional phase changeable material layer.

Figure 12:
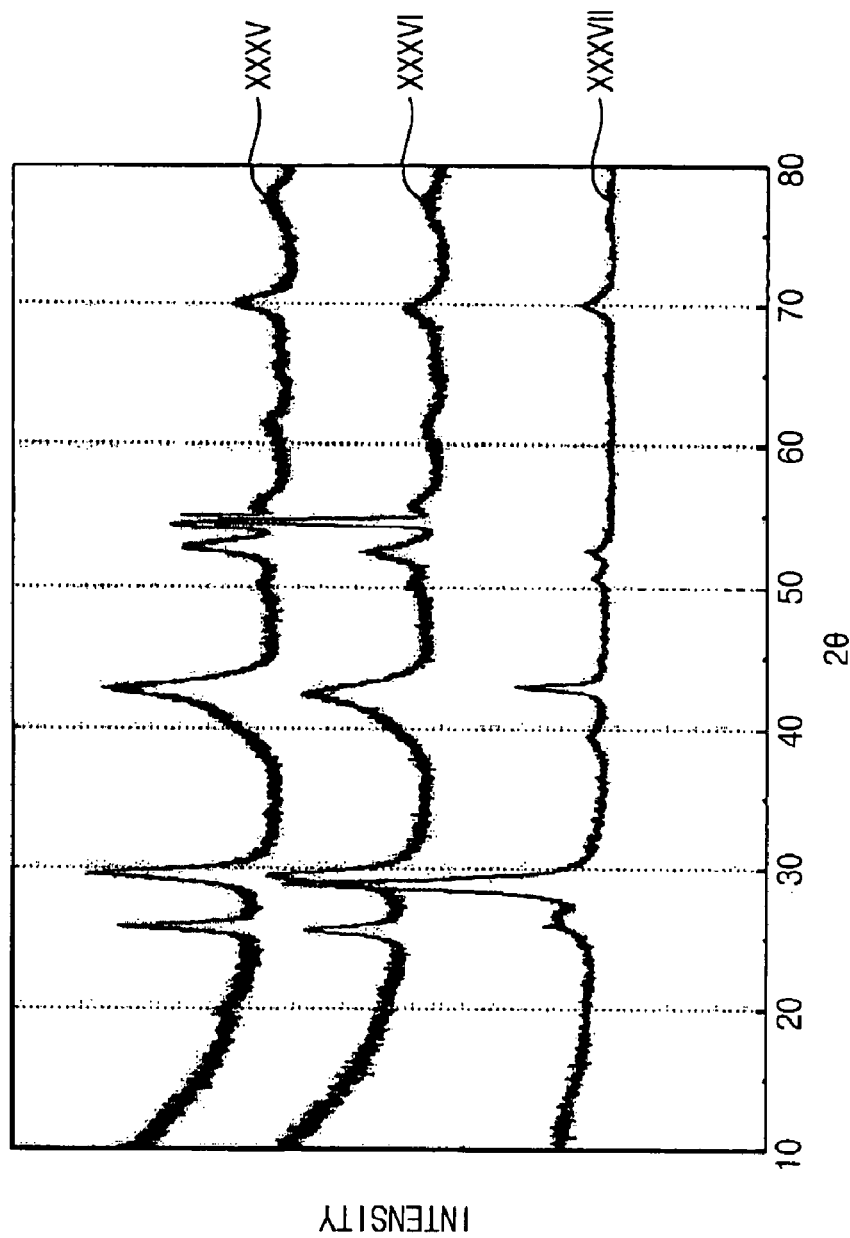
FIG. 12 is a graph illustrating crystalline structures of a phase changeable material layer formed by a conventional PVD process and a phase changeable material layer formed by an example embodiment of the present invention.
Figure 13:
FIG. 13 illustrates a plane view of a phase changeable material layer formed, according to an example embodiment of the present invention.
Figure 14:
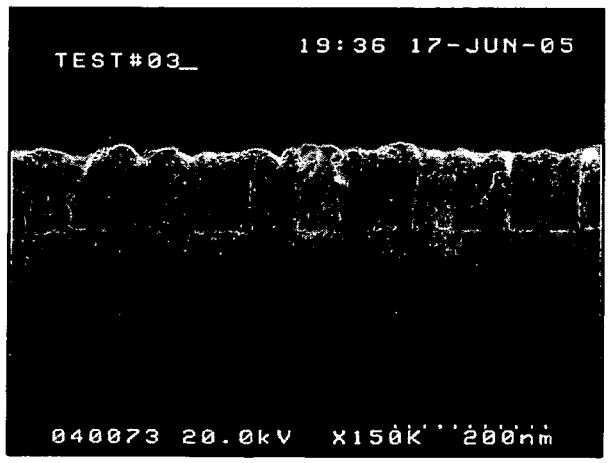
FIG. 14 illustrates a cross-section view of a phase changeable material layer formed, according to an example embodiment of the present invention.

FIG. 12 is a graph showing crystalline structures of the phase changeable material layer formed by the conventional PVD process and the phase changeable material layer formed in accordance with an example embodiment of the present invention. FIG. 13 is an electron microscopic picture illustrating a plan of the phase changeable material layer formed according to an example embodiment of the present invention. FIG. 14 is an electron microscopic picture illustrating a cross-section of the phase changeable material layer formed according to an example embodiment of the present invention.

In FIG. 12, "XXXV" and "XXXVI" represent the crystalline structures of the phase changeable material layers formed by a sputtering process of the conventional PVD process, and "XXXVII" represents the crystalline structure of the phase changeable material layer formed according to some example embodiments of the present invention.

Referring to FIG. 12, the phase changeable material layer formed by the various methods of the present general inventive concept XXXVII includes a face centered cubic (FCC) structure grown along a (200) plane as a dominant crystalline structure. However, the phase changeable material layers formed by the conventional PVD process (e.g., by a sputtering process) do not include dominant FCC structures grown along the (200) planes.

As illustrated in FIGS. 13 and 14, the phase changeable material layer formed by the methods of the present invention XXXVII (FIG. 12) includes uniform columnar grains in accordance with the dominant FCC crystalline structure so that the phase changeable material layer XXXVII has appropriate electrical characteristics. For example, the phase changeable material layer XXXVII has an appropriate sheet resistance of about 825 $\Omega/cm^2$ when the phase changeable material layer has a thickness of about 1,000 Å.

Analysis of Crystalline Structures of Phase Changeable Material Layers

The following are example methods of the present invention being applied to form a phase changeable material layer, based on results from various experiments. It should be understood that these examples are for illustration purposes only and are not intended to limit the scope of the present invention.

EXAMPLE 1

After providing a first source gas including germanium on a substrate for about 1.0 second, a first composite material layer was formed on the substrate by providing a second source gas including tellurium on the substrate for about 0.2 seconds. A third source gas including antimony was provided on the first composite material layer for about 0.4 seconds, and then a second composite material layer was formed on the substrate by providing a fourth source gas including tellurium on the first composite material layer for about 0.2 seconds. Thus, a phase changeable material layer including germanium, antimony and tellurium was formed on the substrate. A concentration ratio of germanium, antimony and tellurium in the phase changeable material layer was about 33.3:13.037:52.7, respectively.

EXAMPLE 2

After providing a first source gas including germanium on a substrate for about 1.0 second, a first composite material layer was formed on the substrate by providing a second source gas including tellurium on the substrate for about 0.3 seconds. A third source gas including antimony was provided on the first composite material layer for about 0.4 seconds, and then a second composite material layer was formed on the substrate by providing a fourth source gas including tellurium on the first composite material layer for about 0.2 seconds. Thus, a phase changeable material layer including germanium, antimony, and tellurium was formed on the substrate. A concentration ratio of germanium, antimony, and tellurium in the phase changeable material layer was about 26.9:15.1:56.3, respectively.

EXAMPLE 3

After providing a first source gas including germanium on a substrate for about 1.0 second, a first composite material layer was formed on the substrate by providing a second source gas including tellurium on the substrate for about 0.4 seconds. A third source gas including antimony was provided on the first composite material layer for about 0.4 seconds, and then a second composite material layer was formed on the substrate by providing a fourth source gas including tellurium on the first composite material layer for about 0.4 seconds. Thus, a phase changeable material layer including germanium, antimony and tellurium was formed on the substrate. A concentration ratio of germanium, antimony and tellurium in the phase changeable material layer was about 21.59:14.5:61.9, respectively.

EXAMPLE 4

After providing a first source gas including germanium on a substrate for about 1.0 second, a first composite material layer was formed on the substrate by providing a second source gas including tellurium on the substrate for about 0.2 seconds. A third source gas including antimony was provided on the first composite material layer for about 0.6 seconds, and then a second composite material layer was formed on the substrate by providing a fourth source gas including tellurium on the first composite material layer for about 0.2 seconds. Thus, a phase changeable material layer including germanium, antimony, and tellurium was formed on the substrate. A concentration ratio of germanium, antimony, and tellurium in the phase changeable material layer was about 29.0:18.4:51.1, respectively.

EXAMPLE 5

After providing a first source gas including germanium on a substrate for about 1.0 second, a first composite material layer was formed on the substrate by providing a second source gas including tellurium on the substrate for about 0.3 seconds. A third source gas including antimony was provided on the first composite material layer for about 0.6 seconds, and then a second composite material layer was formed on the substrate by providing a fourth source gas including tellurium on the first composite material layer for about 0.3 seconds. Thus, a phase changeable material layer including germanium, antimony, and tellurium was formed on the substrate. A concentration ratio of germanium, antimony and tellurium in the phase changeable material layer was about 23.0:20.5:54.5, respectively.

EXAMPLE 6

After providing a first source gas including germanium on a substrate for about 1.0 second, a first composite material layer was formed on the substrate by providing a second source gas including tellurium on the substrate for about 0.4 seconds. A third source gas including antimony was provided on the first composite material layer for about 0.6 seconds, and then a second composite material layer was formed on the substrate by providing a fourth source gas including tellurium on the first composite material layer for about 0.4 seconds. Thus, a phase changeable material layer including germanium, antimony and tellurium was formed on the substrate. A concentration ratio among germanium, antimony, and tellurium in the phase changeable material layer was about 19.1:20.58:58.0, respectively.

EXAMPLE 7

After providing a first source gas including germanium on a substrate for about 1.0 second, a first composite material layer was formed on the substrate by providing a second source gas including tellurium on the substrate for about 0.2 seconds. A third source gas including antimony was provided on the first composite material layer for about 0.8 seconds, and then a second composite material layer was formed on the substrate by providing a fourth source gas including tellurium on the first composite material layer for about 0.2 seconds. Thus, a phase changeable material layer including germanium, antimony, and tellurium was formed on the substrate. A concentration ratio of germanium, antimony, and tellurium in the phase changeable material layer was about 24.4:25.1:48.6, respectively.

EXAMPLE 8

After providing a first source gas including germanium on a substrate for about 1.0 second, a first composite material layer was formed on the substrate by providing a second source gas including tellurium on the substrate for about 0.3 seconds. A third source gas including antimony was provided on the first composite material layer for about 0.8 seconds, and then a second composite material layer was formed on the substrate by providing a fourth source gas including tellurium on the first composite material layer for about 0.3 seconds. Thus, a phase changeable material layer including germanium, antimony, and tellurium was formed on the substrate. A concentration ratio of germanium, antimony, and tellurium in the phase changeable material layer was about 19.3:24.85:53.5, respectively.

EXAMPLE 9

After providing a first source gas including germanium on a substrate for about 1.0 second, a first composite material layer was formed on the substrate by providing a second source gas including tellurium on the substrate for about 0.4 seconds. A third source gas including antimony was provided on the first composite material layer for about 0.8 seconds, and then a second composite material layer was formed on the substrate by providing a fourth source gas including tellurium on the first composite material layer for about 0.4 seconds. Thus, a phase changeable material layer including germanium, antimony, and tellurium was formed on the substrate. A concentration ratio of germanium, antimony, and tellurium in the phase changeable material layer was about 16.7:24.59:56.2, respectively.

Figure 15:
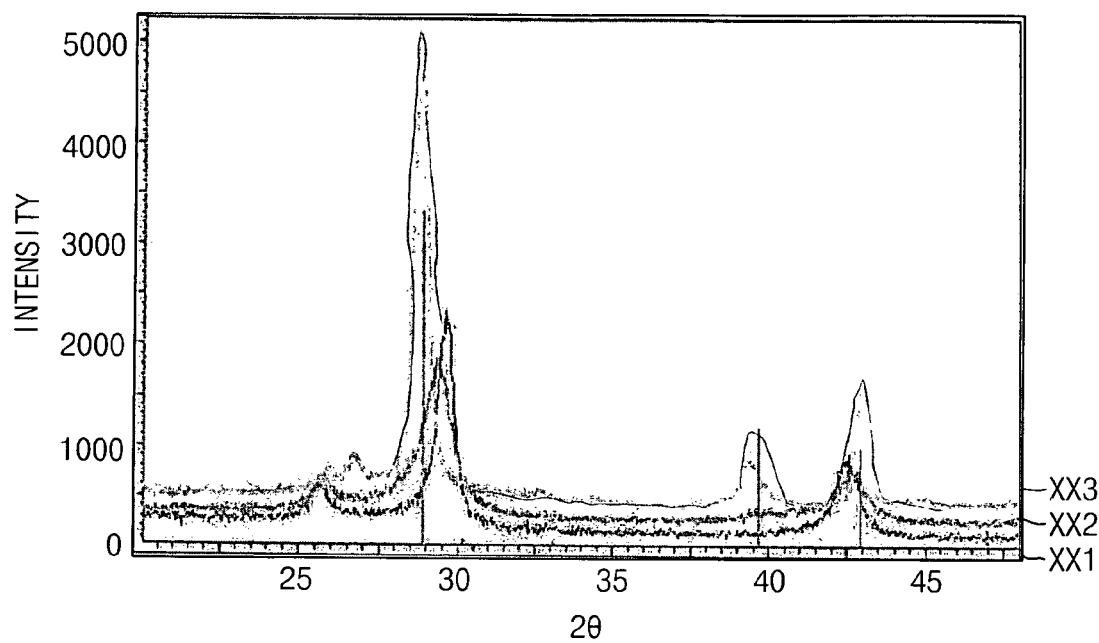
FIG. 15 is a graph illustrating crystalline structures of phase changeable material layers detected using an X-Ray diffractometer, according to Examples 1 to 3 of the present invention.

FIG. 15 is a graph illustrating crystalline structures of phase changeable material layers detected using an X-Ray diffractometer according to Examples 1 to 3 of the present invention. In FIG. 15, "XX1", "XX2" and "XX3" represent crystalline structures of the phase changeable material layers of Examples 1 to 3, respectively. Referring to FIG. 15, the phase changeable material layers of Examples 1 and 2 had crystalline structures that include the dominant FCC structures. However, the phase changeable material layer of Example 3 had the crystalline structure that slightly deviated from the FCC structure. Additionally, the phase changeable material layers of Example 1 and 2 had composition ratios of germanium, antimony, and tellurium (GST) of about 2:2:5, whereas the phase changeable material layer of Example 3 had a composition ratio of germanium, antimony, and tellurium of about 1:2:4, respectively.

Figure 16:
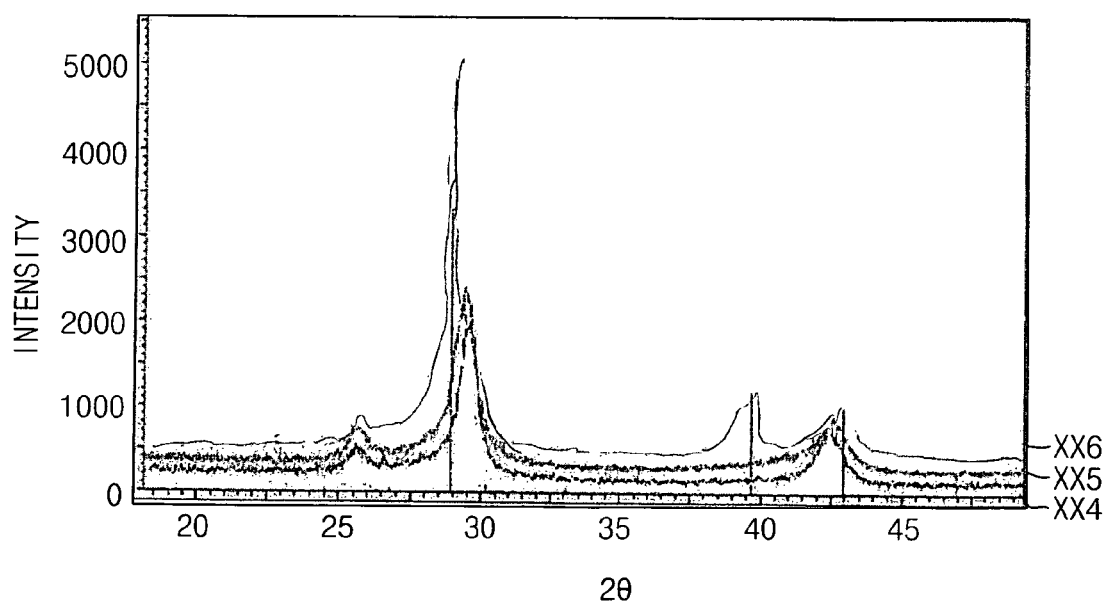
FIG. 16 is a graph illustrating crystalline structures of phase changeable material layers detected using an X-Ray diffractometer, according to Examples 4 to 6 of the present invention.

FIG. 16 is a graph illustrating crystalline structures of phase changeable material layers detected using an X-Ray diffractometer according to Examples 4 to 6 of the present invention. In FIG. 16, "XX4", "XX5" and "XX6" represent the crystalline structures of the phase changeable material layers of Examples 4 to 6, respectively. As illustrated in FIG. 16, the phase changeable material layers of Examples 4 and 5 had the crystalline structures that include the dominant FCC structures. However, the phase changeable material layer of Example 6 had the crystalline structure that slightly deviated from the FCC structure. In addition, the phase changeable material layers of Example 4 and 5 had composition ratios of GST of about 2:2:5, whereas the phase changeable material layer of Example 6 had a composition ratio of GST of about 1:2:4.

Figure 17:
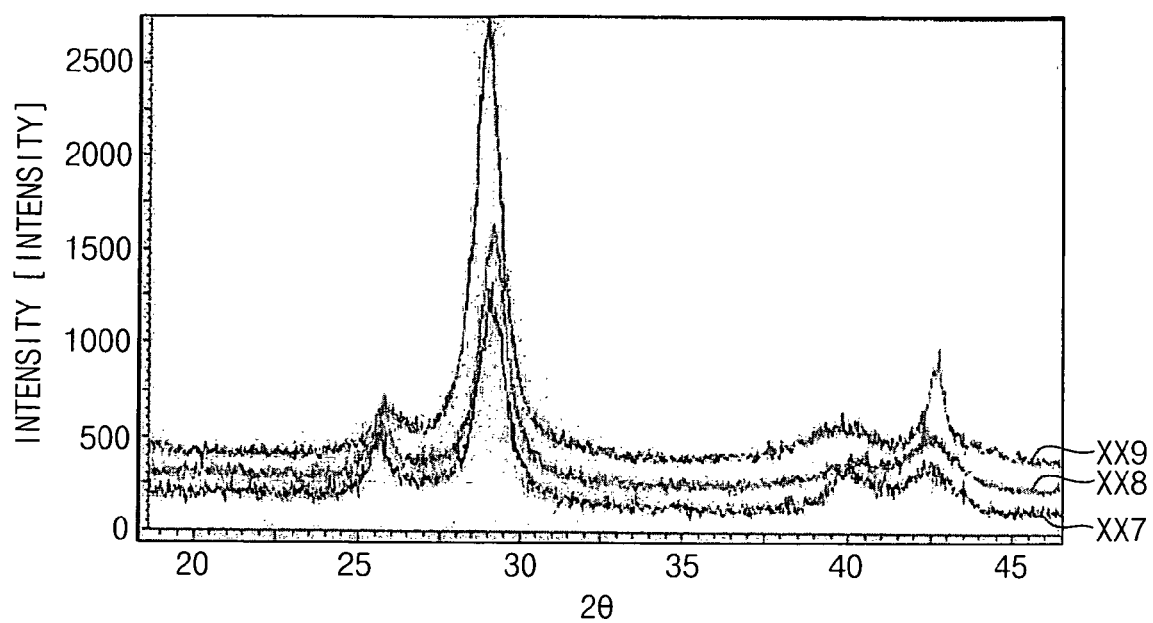
FIG. 17 is a graph illustrating crystalline structures of the phase changeable material layers using an X-Ray diffractometer, according to Examples 7 to 9 of the present invention.

FIG. 17 is a graph illustrating crystalline structures of the phase changeable material layers using an X-Ray diffractometer according to Examples 7 to 9 of the present invention. In FIG. 17, "XX7", "XX8" and "XX9" represent the crystalline structures of the phase changeable material layers of Examples 7 to 9, respectively. As illustrated in FIG. 17, the phase changeable material layers of Examples 7 to 9 generally had GST composition ratios of about 2:2:5. However, the crystalline structures of the phase changeable material layer of Examples 7 to 9 were FCC structures. Therefore, when the source gas including germanium was about 1.0 second, the phase changeable material layer had an appropriate crystalline structure and a GST composition ratio of about 2:2:5 by adjusting the feeding times of the source gases including antimony and tellurium to 0.6 seconds, respectively.

Figure 18A:
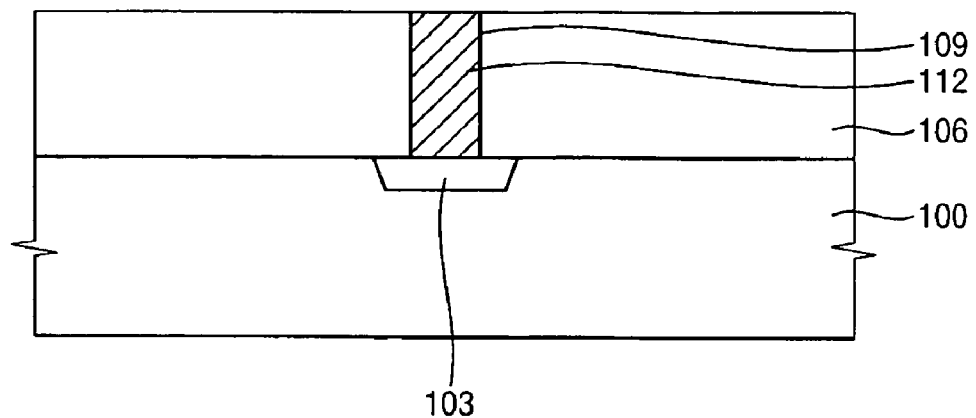
FIGS. 18A to 18H are cross sectional views illustrating a method of manufacturing a phase changeable memory unit, according to an example embodiment of the present invention.

FIGS. 18A to 18H are cross sectional views illustrating a method of manufacturing a phase changeable memory unit according to an example embodiment of the present invention. Referring to FIG. 18A, a first insulating interlayer 106 is formed on a substrate 100 having a lower structure 103. The substrate 100 may include a silicon wafer, a silicon-on-insulator (SOI) substrate, a single crystalline metal oxide substrate, etc. The lower structure 103 may include a contact region, a conductive pattern, a pad, a plug, a contact, a spacer, a mask and/or an insulation pattern formed on the substrate 100.

The first insulating interlayer 106 may include at least one oxide layer and/or at least one nitride layer. For example, the oxide layer may be formed using phosphor silicate glass (PSG), boro-phosphor silicate glass (BPSG), undoped silicate glass (USG), spin on glass (SOG), tetraethylorthosilicate (TEOS), plasma enhanced-TEOS (PE-TEOS), flowable oxide (FOX), high density plasma-chemical vapor deposition (HDP-CVD) oxide, etc.

The nitride layer is formed using silicon nitride (SiXNY). Additionally, the first insulating interlayer 106 may be formed by a chemical vapor deposition (CVD) process, a plasma enhanced chemical vapor deposition (PECVD) process, an atomic layer deposition (ALD) process, a high density plasma-chemical vapor deposition (HDP-CVD) process, etc. The first insulating interlayer 106 may have a sufficient thick thickness to completely cover the lower structure 103 formed on the substrate 100.

The first insulating interlayer 106 is partially etched by a photolithography process, thereby forming a lower contact hole 109 through the first insulating interlayer 106. The lower contact hole 109 partially exposes the lower structure 103 formed on the substrate 100. For example, the contact hole 109 may be formed by an anisotropic etching process.

A first conductive layer (not shown) is formed on the exposed lower structure 103 and the first insulating interlayer 106 to fill up the lower contact hole 109. The first conductive layer may be formed using polysilicon doped with impurities, a metal, a conductive metal nitride, etc. For example, the first conductive layer may be formed using tungsten (W), titanium (Ti), tantalum (Ta), aluminum (Al), copper (Cu), tungsten nitride (WN), titanium nitride (TiN), tantalum nitride (TaN), aluminum nitride (AlN), titanium aluminum nitride (TiAlN), etc. In addition, the first conductive layer may be formed by a sputtering process, a CVD process, an ALD process, an electron beam evaporation process, a pulse laser deposition (PLD) process, etc.

The first conductive layer is partially removed until the first insulating interlayer 106 is exposed using a chemical mechanical polishing, an etch back process, or a combination thereof. Accordingly, a lower contact 112 making contact with the lower structure 103 is formed in the lower contact hole 109.

Figure 18B:
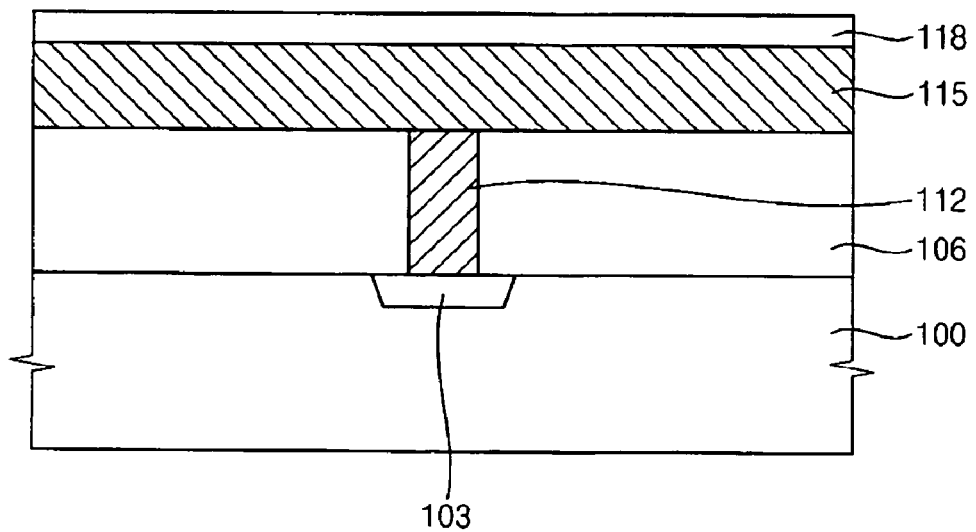

Referring to FIG. 18B, a second conductive layer 115 is formed on the lower contact 112 and the first insulating interlayer 106. The second conductive layer 115 may be formed using doped polysilicon, a metal, or a conductive metal nitride. For example, the second conductive layer 115 may be formed using titanium aluminum nitride, tungsten nitride, titanium nitride, tantalum nitride, aluminum nitride, tungsten, titanium, tantalum, aluminum, copper, etc.

The second conductive layer 115 may be formed by a sputtering process, a CVD process, an ALD process, an electron beam evaporation process, a PLD process, etc. The second conductive layer 115 may include a material substantially identical to that of the first conductive layer. Alternatively, the second conductive layer 115 may be formed using a material that is different from that of the first conductive layer.

A first insulation layer 118 is formed on the second conductive layer 115. The first insulation layer 118 may be formed using a material that has an etching selectivity relative to the second conductive layer 115. For example, the first insulation layer 118 may be formed using a nitride such as silicon nitride or an oxynitride like silicon oxynitride (SiON) or titanium oxynitride (TiON). The first insulation layer 118 may be formed by a CVD process, a PECVD process, an ALD process, an HDP-CVD process, etc.

Figure 18C:
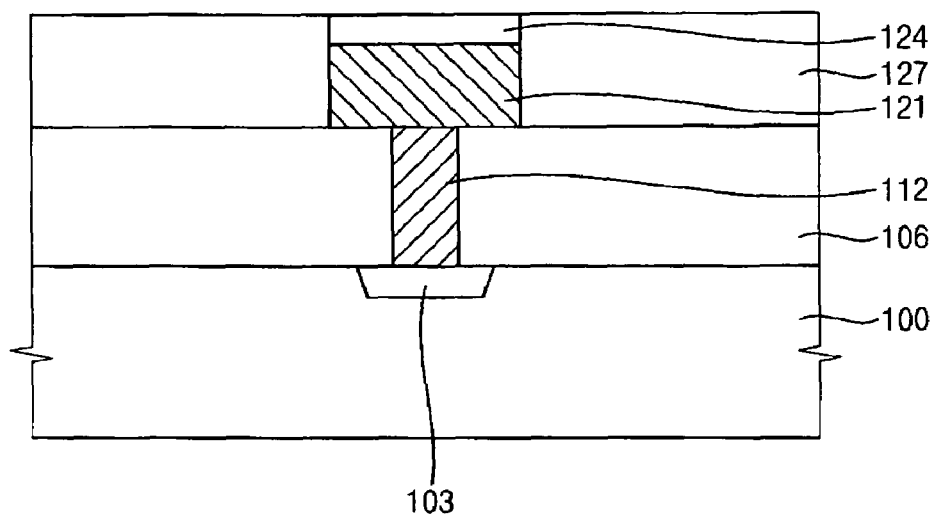

Referring to FIG. 18C, the first insulation layer 118 (see FIG. 18B) is partially etched by a photolithography process to form a first insulation layer pattern 124 on the second conductive layer 115 (see FIG. 18B). Then, the second conductive layer 115 is etched using the first insulation layer pattern 124 as an etching mask to thereby form a pad 121 contacting the lower contact 112. The pad 121 is located on the lower contact 112 and the first insulating interlayer 106. That is, the pad 121 and the first insulation layer pattern 124 are sequentially formed on the lower contact 112 and the first insulating interlayer 106.

A second insulating interlayer 127 is formed on the first insulating interlayer 106 to cover the first insulation layer pattern 124. The second insulating interlayer 127 may include at least one oxide layer and/or at least one nitride layer. For example, the oxide layer may be formed using PSG, BPSG, USG, SOG, TEOS, PE-TEOS, FOX, HDP-CVD oxide, etc. The nitride layer may be formed using silicon nitride. The second insulating interlayer 127 may be formed by a CVD process, a PECVD process, an ALD process, an HDP-CVD process, etc. The second insulating interlayer 127 may be formed using the oxide and/or the nitride substantially identical to the oxide and/or the nitride of the first insulating interlayer 106. Alternatively, the second insulating interlayer 127 may include the oxide and/or the nitride that is different from the oxide and/or the nitride of the first insulating interlayer 106.

The second insulating interlayer 127 is partially removed by an etch back process or a CMP process until the first insulation layer pattern 124 is exposed. Hence, the first insulation layer pattern 124 and the pad 121 are buried in the second insulating interlayer 127.

Figure 18D:
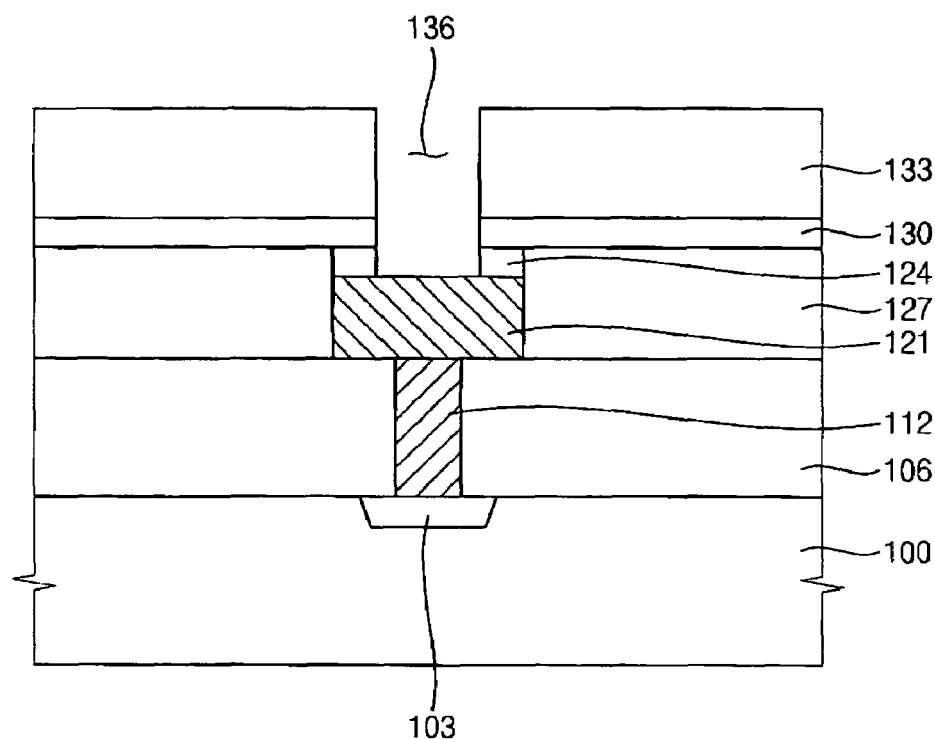

Referring to FIG. 18D, a second insulation layer 130 is formed on the second insulating interlayer 127 and the first insulation layer pattern 124. The second insulation layer 130 may be formed using a nitride or an oxynitride by a CVD process, a PECVD process, an ALD process, or an HDP-CVD process. For example, the second insulation layer 130 may be formed using silicon nitride, silicon oxynitride or titanium oxynitride. The first and the second insulation layers 118 (see FIG. 18B) and 130 may be formed using substantially identical materials. Alternatively, the second insulation layer 130 may be formed using the nitride or the oxynitride different from the nitride or the oxynitride of the first insulation layer 118 (see FIG. 18B).

A sacrificial layer 133 is formed on the second insulating interlayer 130. The sacrificial layer 133 may be formed using oxide by a CVD process, a PECVD process, an ALD process or an HDP-CVD process. For example, the sacrificial layer 133 is formed using PSG, BPSG, FOX, SOG, USG, TEOS, PE-TEOS, HDP-CVD oxide, etc. The sacrificial layer 133 may include the oxide substantially identical to that of the first insulating interlayer 106 and/or that of the second insulating interlayer 127. Alternatively, the sacrificial layer 133 may be formed using the oxide that is different from that of the first insulating interlayer 106 and/or that of the second insulating interlayer 127.

The sacrificial layer 133, the second insulation layer 130, and the first insulation layer pattern 124 are partially etched by a photolithography process, thereby forming an opening 136 exposing the pad 121. The opening 136 may be formed through the sacrificial layer 133, the second insulation layer 130 and the first insulation layer pattern 124 to partially expose the pad 121.

Figure 18E:
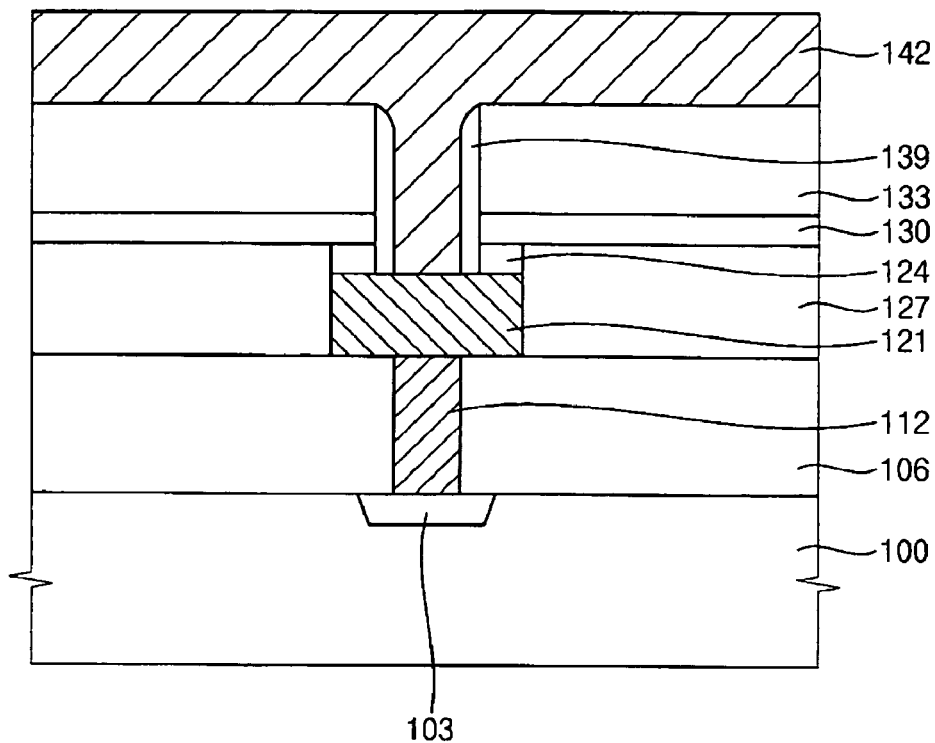

Referring to FIG. 18E, a third insulation layer (not shown) is formed on a sidewall of the opening 136, the exposed pad 121, and the sacrificial layer 133. The third insulation layer may be formed using a nitride by a CVD process, a PECVD process, an ALD process or an HDP-CVD process. For example, the third insulation layer may be formed using silicon nitride. The third insulation layer may be partially removed by an anisotropic etching process to form a preliminary spacer 139 on the sidewall of the opening 136. The preliminary spacer 139 is positioned from an upper face of the pad 121 to a sidewall of the sacrificial layer 133.

A third conductive layer 142 is formed on the pad 121 and the sacrificial layer 133 to fill up the opening 136. The third conductive layer 142 may be formed using doped polysilicon, a metal or a conductive metal nitride. For example, the third conductive layer 142 may be formed using tungsten, tungsten nitride, titanium, titanium nitride, tantalum, tantalum nitride, molybdenum nitride (MoN), niobium nitride (NbN), titanium silicon nitride (TiSiN), aluminum, titanium aluminum nitride, titanium boron nitride (TiBN), zirconium silicon nitride (ZiSiN), tungsten silicon nitride (WSiN), tungsten boron nitride (WBN), zirconium aluminum nitride (ZrAlN), molybdenum silicon nitride (MoSiN), molybdenum aluminum nitride (MoAlN), tantalum silicon nitride (TaSiN), tantalum aluminum nitride (TaAlN), etc. These materials can be used alone or in a mixture thereof to form the third conductive layer 142. The third conductive layer 142 may be formed by a sputtering process, a CVD process, an ALD process, a PLD process, etc.

Figure 18F:
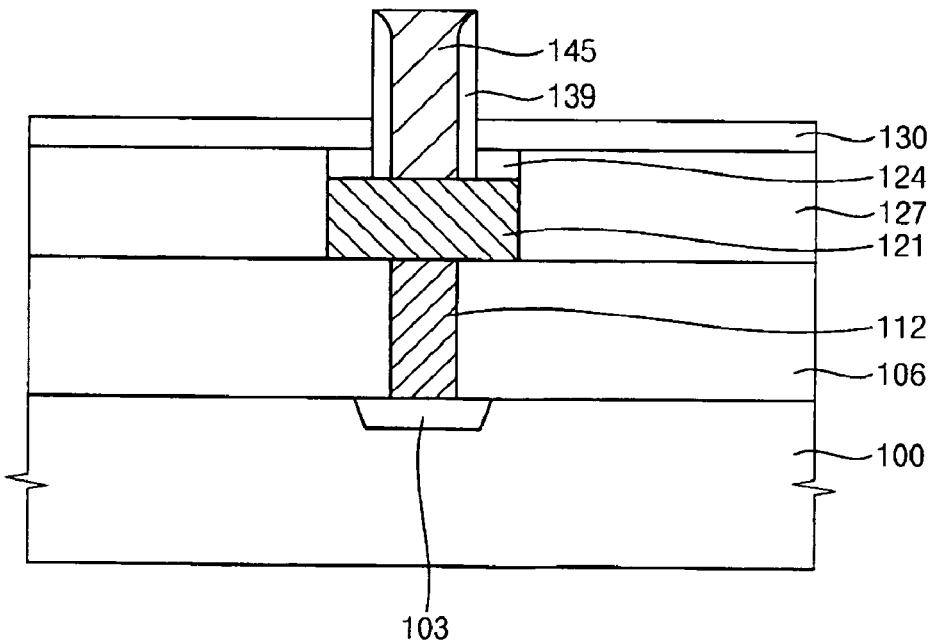

Referring to FIG. 18F, the third conductive layer 142 is partially removed by a CMP process until the sacrificial layer 133 is exposed. Accordingly, a preliminary lower electrode 145 is formed in the opening 136. The preliminary spacer 139 is located on a sidewall of the preliminary lower electrode 145.

The sacrificial layer 133 is removed by an etch back process or a CMP process to expose the second insulation layer 130. When the sacrificial layer 133 is removed, the preliminary spacer 139 and the preliminary lower electrode 145 protrude as pillar shapes.

Figure 18G:
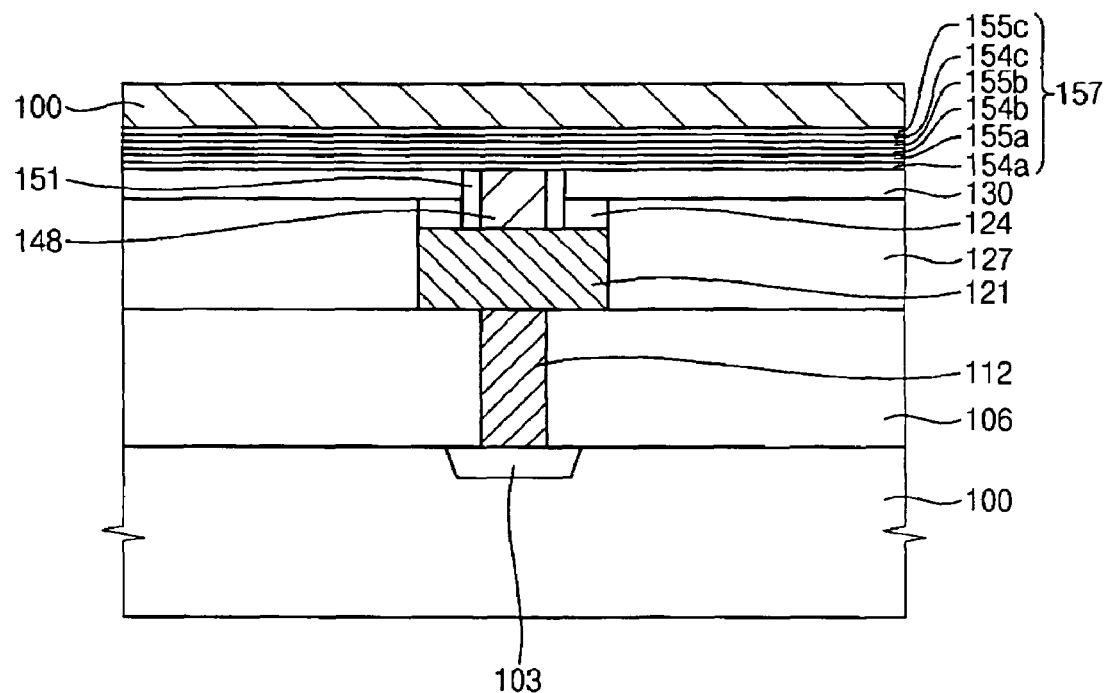

Referring to FIG. 18G, upper portions of the preliminary spacer 139 and the preliminary lower electrode 145 are removed by a CMP process to thereby form a lower electrode 148 and a spacer 151 on the pad 121. The spacer 151 and the lower electrode 148 are buried in the first insulation layer pattern 124 and the second insulation layer 130. That is, the first insulation layer pattern 124 and the second insulation layer 130 together enclose the lower electrode 148 and the spacer 151. Therefore, the lower electrode 148 may have an improved structural stability. Additionally, the spacer 151 reduces a width of the lower electrode 148. When the spacer 151 is formed on the sidewall of the opening 136, the opening 136 has a width that is reduced by twice a thickness of the spacer 151. Thus, the lower electrode 148 that is buried in the opening 136 also has a reduced width. When the opening 136 has a minute width, the lower electrode 148 enclosed by the first insulation layer pattern 124 and the second insulation layer 130 may be formed in the minute opening 136 without formation of the spacer 151.

A phase changeable material layer 157 is formed on the lower electrode 148, the spacer 151, and the second insulation layer 130. The phase changeable material layer 157 includes a plurality of first composite material layers 154a, 154b, and 154c, and a plurality of second composite material layers 155a, 155b and 155c. Each of the first composite material layers 154a, 154b and 154c may include germanium and tellurium, and each of the second composite material layers 155a, 155b and 155c may include antimony and tellurium, or vice versa. As a result, the phase changeable material layer 157 may include germanium-antimony-tellurium. The phase changeable material layer 157 having the first and the second composite material layers 154a, 154b, 154c, 155a, 155b and 155c may be formed by the methods described with reference to FIGS. 1 and 2. Although FIGS. 18G through 18G illustrate that the first and second composite layers 154 and 155 are physically identifiable, the first and second composite layers 154 and 155 may not be physically identifiable. In other words, the phase changeable material layer 157 may be a substantially homogenous layer having a substantially uniform GST concentration.

A fourth conductive layer 160 is formed on the phase changeable material layer 157. The fourth conductive layer 160 may be formed using doped polysilicon, a metal or a conductive metal nitride. For example, the fourth conductive layer 160 may be formed using tungsten, tungsten nitride, titanium, titanium nitride, tantalum, tantalum nitride, molybdenum nitride, niobium nitride, titanium silicon nitride, aluminum, titanium aluminum nitride, titanium boron nitride, zirconium silicon nitride, tungsten silicon nitride, tungsten boron nitride, zirconium aluminum nitride, molybdenum silicon nitride, molybdenum aluminum nitride, tantalum silicon nitride, tantalum aluminum nitride, etc. These materials can be used alone or in a mixture thereof to form the fourth conductive layer 160. The fourth conductive layer 160 may be formed by a sputtering process, a CVD process, an ALD process, a PLD process, etc.

Figure 18H:
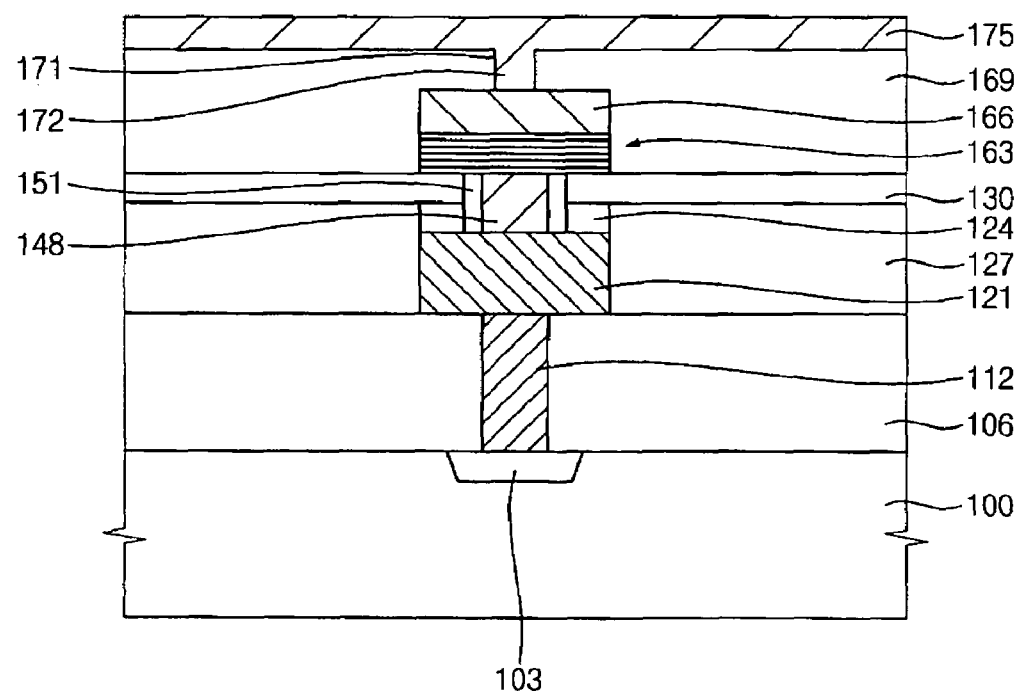

Referring to FIG. 18H, the fourth conductive layer 160 (see FIG. 18G) and the phase changeable material layer 157 (see FIG. 18G) are etched by a photolithography process, thereby forming a phase changeable material layer pattern 163 and an upper electrode 166 on the lower electrode 148 and the second insulation layer 130. Particularly, the phase changeable material layer pattern 163 is positioned on the lower electrode 148, the spacer 151 and the second insulation layer 130. The upper electrode 166 is located on the phase changeable material layer pattern 163. Each of the phase changeable material layer pattern 163 and the upper electrode 166 has an area that is substantially larger than that of the lower electrode 148.

A third insulating interlayer 169 is formed on the second insulation layer 130 to cover the upper electrode 166. The third insulating interlayer 169 may include at least one oxide layer and/or at least one nitride layer. As described above, the oxide layer is formed using PSG, BPSG, USG, SOG, TEOS, PE-TEOS, FOX, HDP-CVD oxide, etc. The nitride layer is formed using silicon nitride. The third insulating interlayer 169 may be formed by a CVD process, a PECVD process, an ALD process or an HDP-CVD process. The third insulating interlayer 169 may include a material that is substantially identical to that of the first insulating interlayer 106 and/or that of the second insulating interlayer 127. Alternatively, the third insulating interlayer 169 may be formed using a material that is different from that of the first insulating interlayer 106 and/or that of the second insulating interlayer 127.

An upper contact hole 171 is formed through the third insulating interlayer 169 by partially etching the third insulating interlayer 169. The upper contact hole 171 that exposes the upper electrode 166 may be formed by a photolithography process. An upper contact 172 is formed on the upper electrode 166 in the upper contact hole 171, and an upper wiring 175 is formed on the upper contact 172 and the third insulating interlayer 169. As a result, the phase changeable memory unit is formed on the substrate 100. The upper contact 172 and the upper wiring 175 may be formed using doped polysilicon, a metal or a conductive metal nitride. For example, the upper contact 172 and the upper wiring 175 may be formed using aluminum, tungsten, titanium, tantalum, copper, tungsten nitride, aluminum nitride, titanium nitride, tantalum nitride, titanium aluminum nitride, etc. The upper contact 172 and the upper wiring 175 may be formed by a sputtering process, a CVD process, an ALD process, an electron beam evaporation process, a PLD process, etc.

Figure 19A:
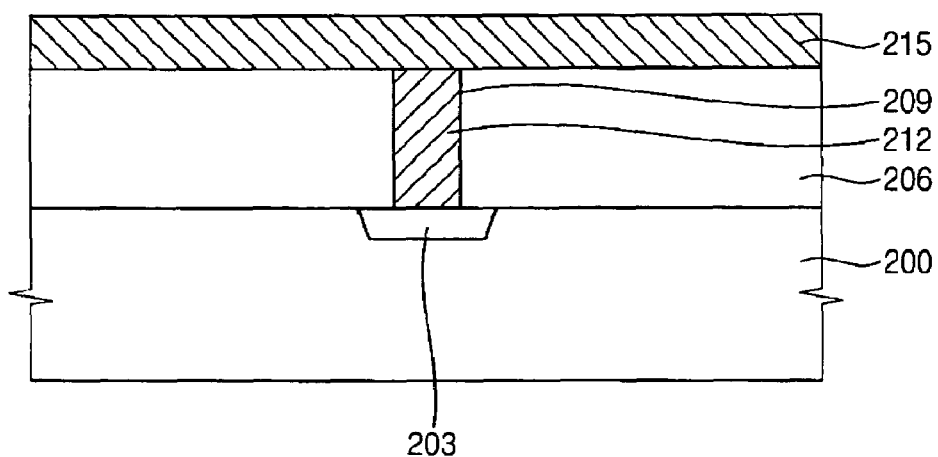
FIGS. 19A to 19F are cross-sectional views illustrating a method of manufacturing a phase changeable memory unit, according to an example embodiment of the present invention.

FIGS. 19A to 19F are cross-sectional views illustrating a method of manufacturing a phase changeable memory unit according to another embodiment of the present general inventive concept. Referring to FIG. 19A, after a lower structure 203 is formed on a substrate 200, a first insulating interlayer 206 including at least one oxide layer and/or at least one nitride layer is formed on the substrate 200. The first insulating interlayer 206 may be formed by a CVD process, a PECVD process, an ALD process, an HDP-CVD process, etc. The first insulating interlayer 206 is partially etched by a photolithography process to form a lower contact hole 209 that partially exposes the lower structure 203.

A first conductive layer (not shown) is formed on the exposed lower structure 203 and the first insulating interlayer 206 to fill up the lower contact hole 209. The first conductive layer may be formed using polysilicon doped with impurities, a metal or a conductive metal nitride by a sputtering process, a CVD process, an ALD process, an electron beam evaporation process or a PLD process.

The first conductive layer is partially removed by a CMP process or an etch back process until the first insulating interlayer 206 is exposed so that a lower contact 212 making contact with the lower structure 203 is formed in the lower contact hole 209.

A second conductive layer 215 is then formed on the lower contact 212 and the first insulating interlayer 206. The second conductive layer 215 may be formed using doped polysilicon, a metal or a conductive metal nitride by a sputtering process, a CVD process, an ALD process, an electron beam evaporation process or a PLD process.

Figure 19B:
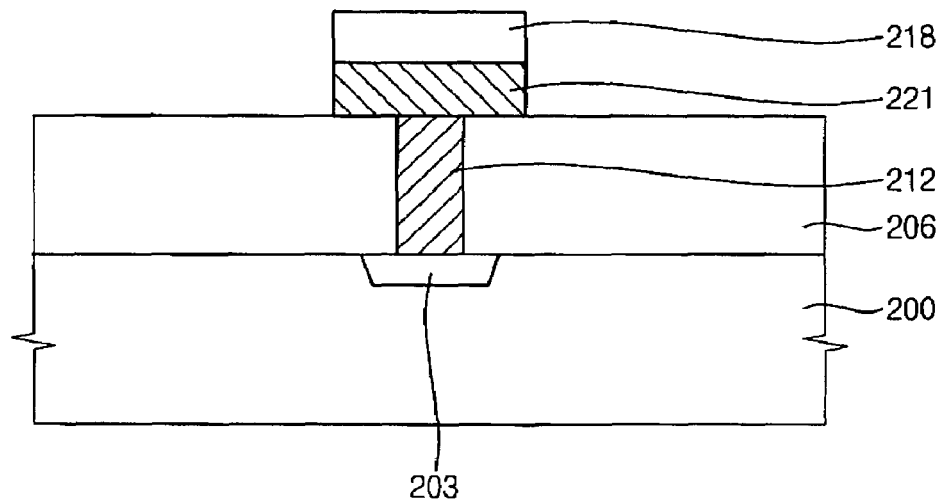

Referring to FIG. 19B, a first insulation layer (not shown) is formed on the second conductive layer 215 (see FIG. 19A). The first insulation layer may be formed using silicon nitride, silicon oxynitride or titanium oxynitride by a CVD process, a PECVD process, an ALD process or an HDP-CVD process.

The first insulation layer is then partially etched by a photolithography process to form a first insulation layer pattern 218 on the second conductive layer 215 (see FIG. 19A). The first insulation layer pattern 218 is formed on a portion of the second conductive layer 215 where the lower contact 212 is positioned. The first insulation layer pattern 218 serves as an etching mask to etch the second conductive layer 215, and supports a phase changeable material layer pattern 237 (see FIG. 19D).

The second conductive layer 215 is etched using the first insulation layer pattern 218 as the etching mask to form a lower electrode 221 on the lower contact 212 and the first insulating interlayer 206. The lower electrode 221 is electrically connected to the lower structure 203 through the lower contact 212.

Figure 19C:
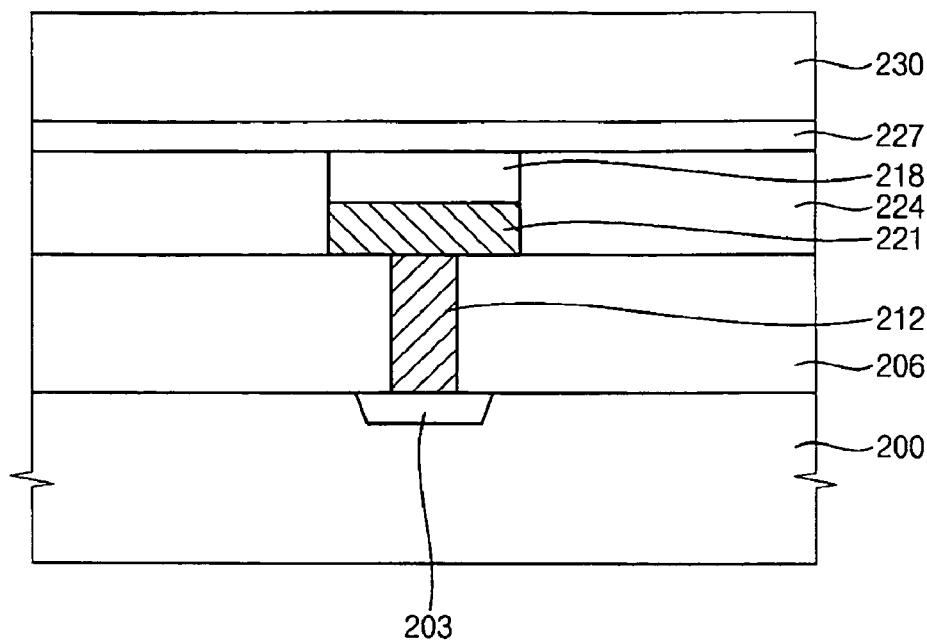

Referring to FIG. 19C, a second insulating interlayer 224 including at least one oxide layer and/or at least one nitride layer is formed on the first insulating interlayer 206 to cover the lower electrode 221 and the first insulation layer pattern 218. The second insulating interlayer 224 may be formed by a CVD process, a PECVD process, an ALD process or an HDP-CVD process.

An upper portion of the second insulating interlayer 224 is partially removed by an etch back process or a CMP process until the first insulation layer pattern 218 is exposed. Thus, the second insulating interlayer 224 is planarized, and the first insulation layer pattern 218 and the lower electrode 221 are buried in planarized the second insulating interlayer 224.

A second insulation layer 227 is formed on the second insulating interlayer 224 and the first insulation layer pattern 218. The second insulation layer 227 may be formed using a nitride or an oxynitride by a CVD process, a PECVD process, an ALD process or an HDP-CVD process.

A sacrificial layer 230 is formed on the second insulation layer 227. The sacrificial layer 230 may be formed using oxide by a CVD process, a PECVD process, an ALD process or an HDP-CVD process.

Figure 19D:
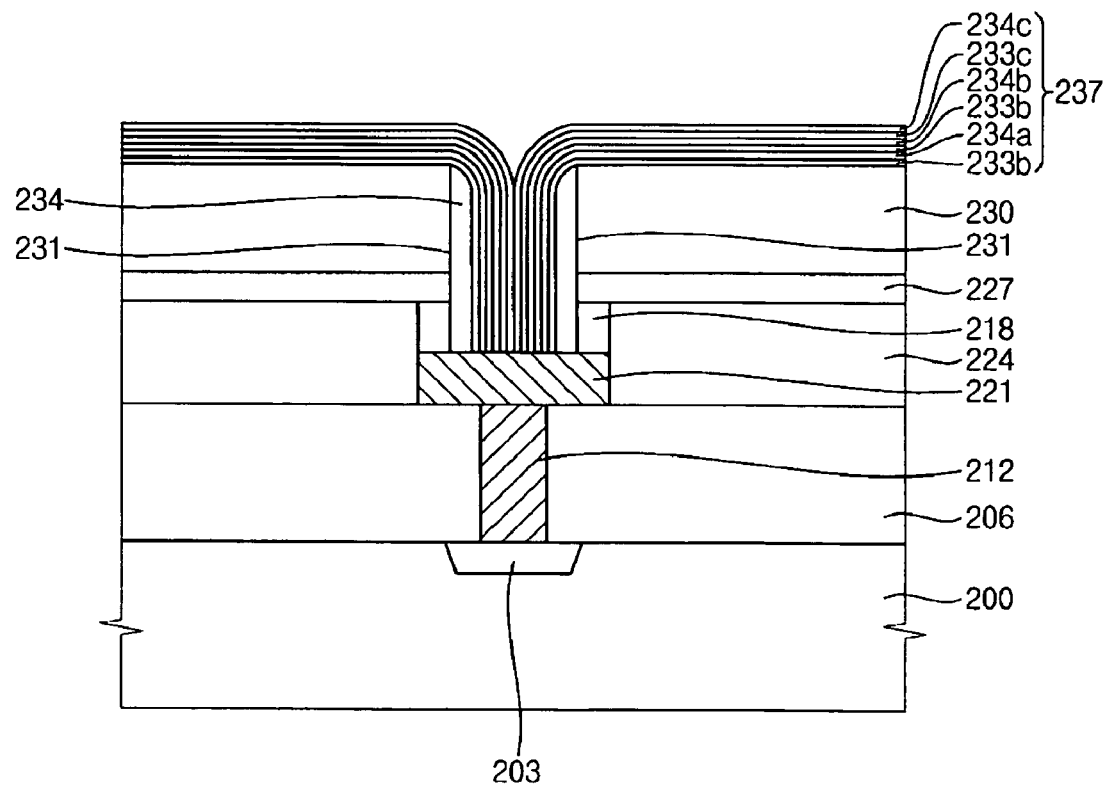

Referring to FIG. 19D, the sacrificial layer 230, the second insulation layer 227, and the first insulation layer pattern 218 are partially etched by a photolithography process, thereby forming an opening 231 that exposes the lower electrode 221. The opening 231 is formed through the sacrificial layer 230, the second insulation layer 227, and the first insulation layer pattern 218 to partially expose the lower electrode 221.

A third insulation layer (not shown) is formed on the exposed lower electrode 221, a sidewall of the opening 231, and the sacrificial layer 230. The third insulation layer may be formed using a nitride by a CVD process, a PECVD process, an ALD process or an HDP-CVD process.

The third insulation layer is partially removed by an anisotropic etching process to form a preliminary spacer 234 on the sidewall of the opening 231 only. When the preliminary spacer 234 is formed from an upper face of the lower electrode 221 to a sidewall of the sacrificial layer 230, the opening 231 has a width that is reduced by about twice a thickness of the preliminary spacer 234.

Figure 19E:
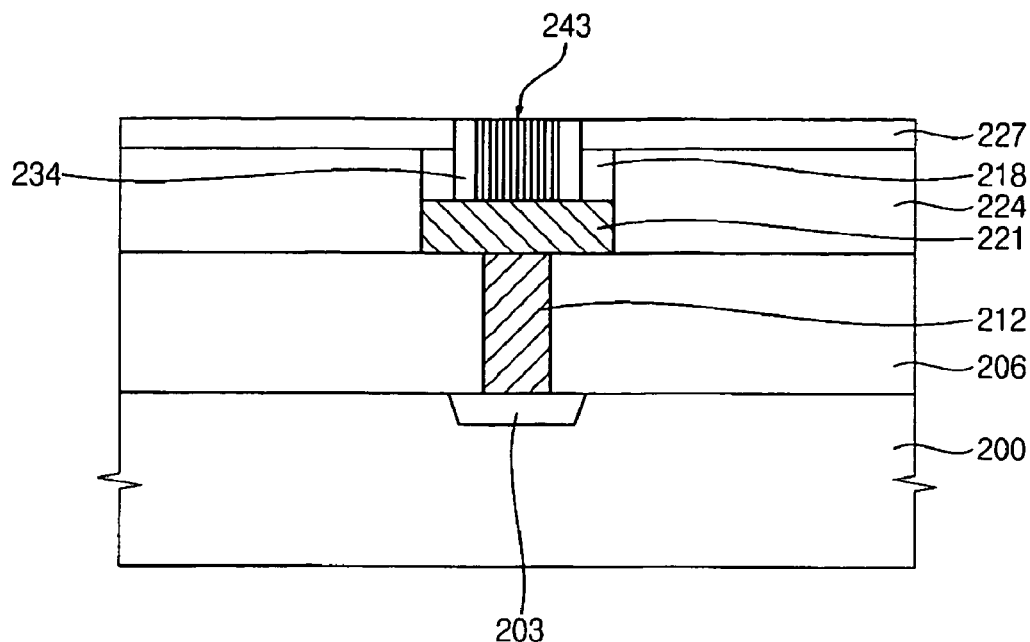
Figure 19F:
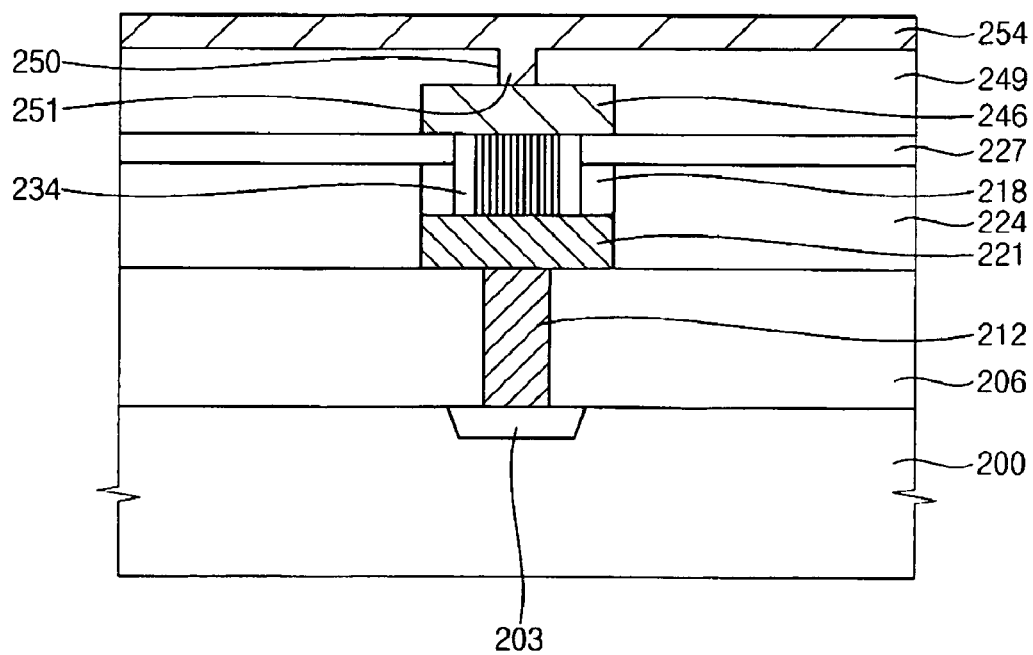

A phase changeable material layer 237 is then formed on the lower electrode 221 and the sacrificial layer 230 to fill up the opening 231 by the methods described with reference to FIGS. 1 and 2. Since the opening 231 has the reduced width, the phase changeable material layer 237 also has a reduced width. When the opening 231 has a minute width, the phase changeable material layer 237 may be directly formed to fill up the opening 231 without formation of the preliminary spacer 234. The phase changeable material layer 237 includes a plurality of first composite material layers 233a, 233b and 233c, and a plurality of second composite material layers 234a, 234b and 234c. The first composite material layers 233a, 233b and 233c may include germanium and tellurium, and the second composite material layers 234a, 234b and 234c may include antimony and tellurium, or vice versa. Accordingly, the phase changeable material layer 237 includes germanium-antimony-tellurium. Although FIGS. 19D through 19F illustrate that the first and second composite layers 233 and 234 are physically identifiable, the first and second composite layers 233 and 234 may not be physically identifiable. In other words, the phase changeable material layer 157 may be a substantially homogenous layer having a substantially uniform GST concentration.

Referring to FIG. 19E, the phase changeable material layer 237 (see FIG. 19D) is partially removed by a CMP process until the sacrificial layer 230 (see FIG. 19D) is exposed so that a preliminary phase changeable material layer pattern (not shown) is formed on the lower electrode 221 in the opening 231 (see FIG. 19D). The preliminary phase changeable material layer pattern may be formed using a slurry that contains ceria as an abrasive. Here, the preliminary spacer 234 (see FIG. 19D) encloses a sidewall of the preliminary phase changeable material layer pattern.

The sacrificial layer 230 (see FIG. 19D) is removed by an etch back process or a CMP process to expose the second insulation layer 227. When the sacrificial layer 230 (see FIG. 19D) is removed, the preliminary spacer 234 (see FIG. 19D) and the preliminary phase changeable material layer pattern protrude from the second insulation layer 227 as pillar shapes.

Upper portions of the preliminary spacer 234 and the preliminary phase changeable material layer pattern are removed by a CMP process or an etch back process, thereby forming a spacer 240 and a phase changeable material layer pattern 243 on the lower electrode 221. In formations of the spacer 240 and the phase changeable material layer pattern 243, the second insulation layer 227 serves as a polishing stop layer and/or an etch stop layer.

Referring to FIG. 19F, a third conductive layer (not shown) is formed on the second insulation layer 227, the spacer 240 and the phase changeable material layer pattern 243. The third conductive layer may be formed using doped polysilicon, a metal or a conductive metal nitride. The third conductive layer may be formed by a sputtering process, a CVD process, an ALD process, an electron beam evaporation process, a PLD process, etc. The third conductive layer is partially etched by a photolithography process to thereby form an upper electrode 246 on the phase changeable material layer pattern 243 and the second insulation layer 227. Each of the upper electrode 246 and the lower electrode 221 has an area substantially larger than that of the phase changeable material layer pattern 243 (see FIG. 19E).

A third insulating interlayer 249 is formed on the second insulation layer 227 to cover the upper electrode 246. The third insulating interlayer 249 may include at least one oxide layer and/or at least one nitride layer. The third insulating interlayer 249 may be formed by a CVD process, a PECVD process, an ALD process or an HDP-CVD process. An upper contact hole 250 that exposes the upper electrode 246 is formed through the third insulating interlayer 249 by partially etching the third insulating interlayer 249. An upper contact 251 is formed on the upper electrode 246 in the upper contact hole 250, and an upper wiring 254 is formed on the upper contact 251 and the third insulating interlayer 249. Accordingly, the phase changeable memory unit is formed on the substrate 200. The upper contact 251 and the upper wiring 254 may be formed using doped polysilicon, a metal or a conductive metal nitride by a sputtering process, a CVD process, an ALD process, an electron beam evaporation process or a PLD process.

Figure 20A:
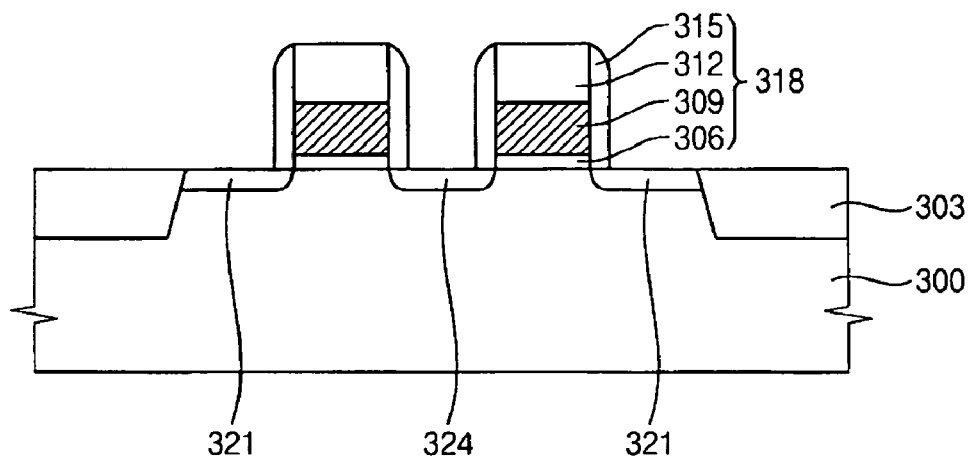
FIGS. 20A to 20H are cross-sectional views illustrating a method of manufacturing a phase changeable semiconductor memory device, according to an example embodiment of the present invention.

FIGS. 20A to 20H are cross-sectional views illustrating a method of manufacturing a phase changeable semiconductor memory device according to an embodiment of the present general inventive concept. Referring to FIG. 20A, an isolation layer 303 is formed on a semiconductor substrate 300 to define an active region and a field region. The isolation layer 303 may be formed by an isolation process such as a shallow trench isolation (STI) process or a local oxidation of silicon (LOCOS) process. For example, the isolation layer 303 may be formed using an oxide.

A gate insulation layer (not shown), a gate conductive layer (not shown) and a gate mask layer (not shown) are sequentially formed on the active region of the semiconductor substrate 300. The gate insulation layer may be formed using an oxide or a material oxide having a high dielectric constant. For example, the gate insulation layer may be formed using silicon oxide, hafnium oxide, zirconium oxide, titanium oxide, titanium oxide, tantalum oxide, aluminum oxide, etc. The gate insulation layer may be formed by a thermal oxidation process, a CVD process, a PECVD process, an ALD process, an HDP-CVD process, etc.

The gate conductive layer may be formed using doped polysilicon, a metal or a metal silicide. For example, the gate conductive layer may be formed using tungsten, aluminum, titanium, tantalum, tungsten silicide, titanium silicide, cobalt silicide, etc. The gate conductive layer may be formed by a CVD process, a PECVD process, an ALD process, etc.

The gate mask layer may be formed using a material that has an etching selectivity relative to the gate conductive layer and the gate insulation layer. For example, the gate mask layer may be formed using silicon nitride, silicon oxynitride or titanium oxynitride. The gate mask layer may be formed by a CVD process, a PECVD process, a sputtering process, an ALD process, etc.

The gate mask layer, the gate conductive layer, and the gate insulation layer are patterned to sequentially form a gate insulation layer pattern 306, a gate electrode 309, and a gate mask 312 on the semiconductor substrate 300.

A first insulation layer (not shown) is formed on the semiconductor substrate 300 to cover the gate mask 312. The first insulation layer is anisotropically etched to form a gate spacer 315 on sidewalls of the gate insulation layer pattern 306, the gate electrode 309, and the gate mask 312. As a result, a gate structure 318 is formed on the semiconductor substrate 300. The gate structure 318 includes the gate insulation layer pattern 306, the gate electrode 309, the gate mask 312, and the gate spacer 315.

A first contact region 321 and a second contact region 324 are formed at portions of the semiconductor substrate 300 between the gate structures 318 by an ion implantation process using the gate structures 318 as ion implantation masks. Accordingly, transistors including the first contact region 321, the second contact region 324, and the gate structures 318 are formed on the semiconductor substrate 300. For example, the first and the second contact regions 321 and 324 may correspond to source/drain regions of the transistors.

Figure 20B:
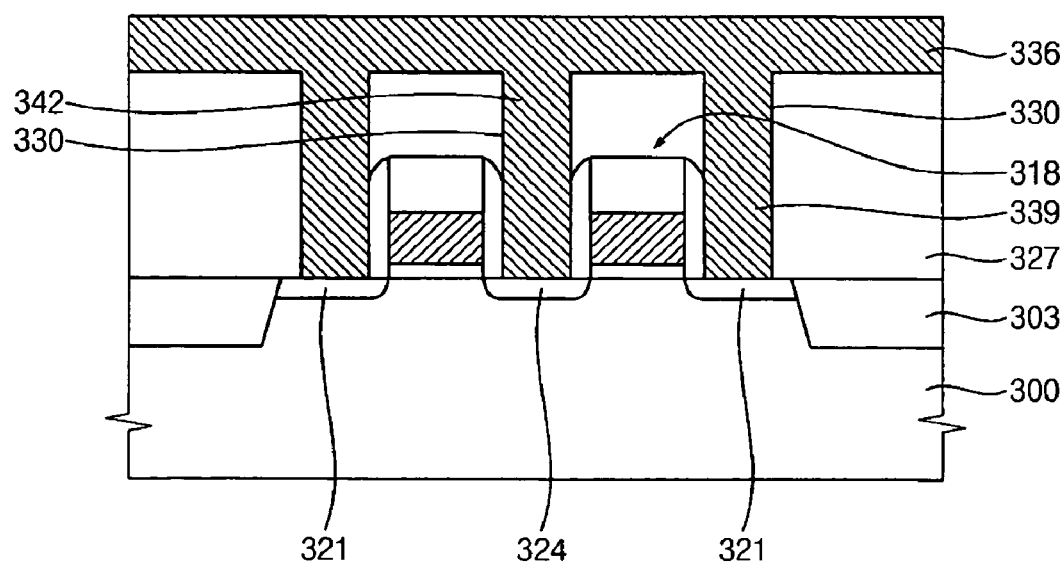

Referring to FIG. 20B, a first insulating interlayer 327 is formed on the semiconductor substrate 300 to cover the transistors. The first insulating interlayer 327 may be formed using an oxide such as PSG, BPSG, USG, SOG, TEOS, PE-TEOS, FOX, HDP-CVD oxide, etc. The first insulating interlayer 327 may be formed by a CVD process, a PECVD process, an ALD process, an HDP-CVD process, etc. The first insulating interlayer 327 is partially etched by a photolithography process so that first and second lower contact holes 330 are formed through the first insulating interlayer 327. The first and the second lower contact holes 330 expose the first and the second contact regions 321 and 324.

A first conductive layer 336 is formed on the first insulating interlayer 327 to fill up the first and the second lower contact holes 330. The first conductive layer 336 may be formed using polysilicon doped with impurities, a metal, a conductive metal nitride, etc. The first conductive layer 336 may be formed by a sputtering process, a CVD process, an ALD process, an electron beam evaporation process, a pulse laser deposition (PLD) process, etc. For example, the first conductive layer 336 may be formed using tungsten, titanium, titanium nitride, tantalum, tantalum nitride, aluminum, aluminum nitride, titanium aluminum nitride, tungsten nitride, etc. These materials can be used alone or in a mixture thereof to form the first conductive layer 336.

Figure 20C:
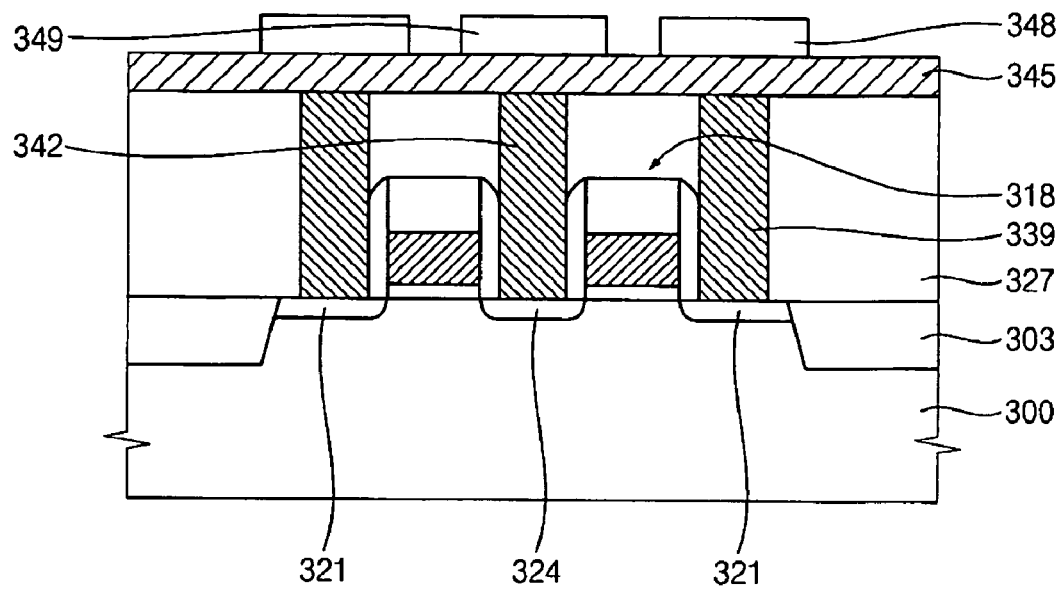

Referring to FIG. 20C, the first conductive layer 336 (see FIG. 20B) is partially removed by a CMP process and/or an etch back process until the first insulating interlayer 327 is exposed. Hence, a first lower contact 339 and a second lower contact 342 are formed in the first lower contact holes 330 (see FIG. 20B), respectively. The first lower contact 339 is positioned on the first contact region 321, and the second lower contact 342 is formed on the second contact region 324. A second conductive layer 345 is formed on the first insulating interlayer 327 and the first and the second lower contacts 339 and 342. The second conductive layer 345 may be formed using doped polysilicon, a metal or a conductive metal nitride by a sputtering process, a CVD process, an ALD process, an electron beam evaporation process or a PLD process.

After a second insulation layer (not shown) is formed on the second conductive layer 345, the second insulation layer is partially etched by a photolithography process. Thus, a first insulation layer pattern 348 and a second insulation layer pattern 349 are formed on the second conductive layer 345. The second insulation layer may be formed using a nitride or an oxynitride by a CVD process, a PECVD process, an ALD process or an HDP-CVD process. The first insulation layer pattern 348 is formed on one portion of the second conductive layer 345 under which the first lower contact 339 is positioned. Additionally, the second insulation layer pattern 349 is formed on another portion of the second conductive layer 345 where the second lower contact 342 is positioned.

Figure 20D:
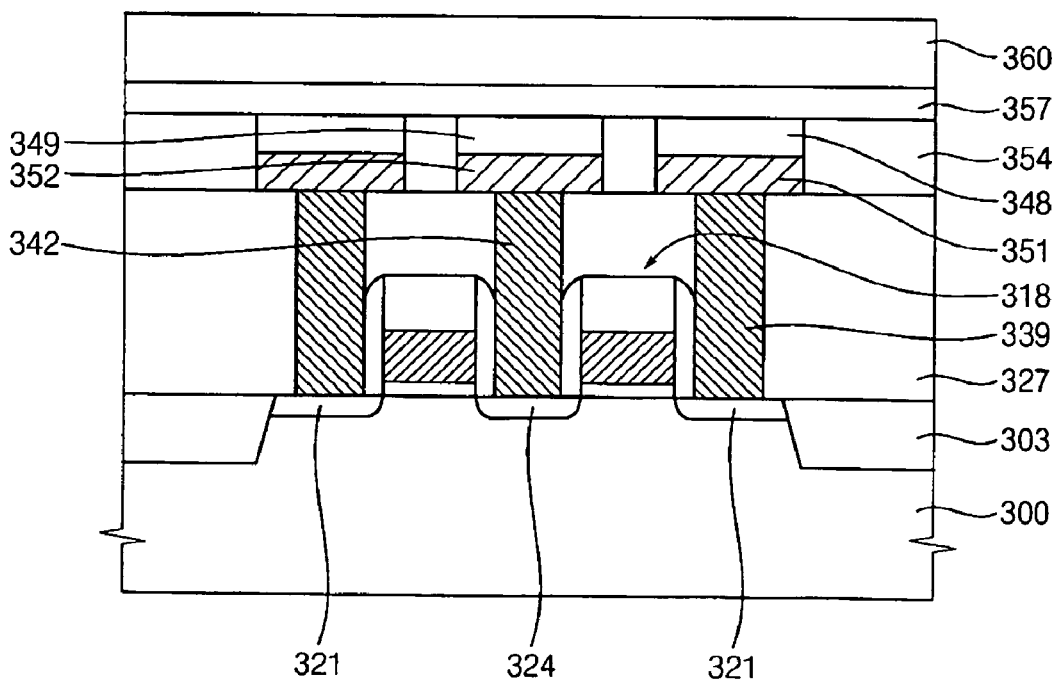

Referring to FIG. 20D, the second conductive layer 345 (see FIG. 20C) is partially etched using the first and the second insulation layer patterns 348 and 349, thereby simultaneously forming a pad 351 and a lower wiring 352. The pad 351 is located on the first lower contact 339 and the first insulating interlayer 327. The lower wiring 352 is positioned on the second lower contact 342 and the first insulating interlayer 327. Thus, the pad 351 is electrically connected to the first contact region 321 through the first lower contact 339, and the lower wiring 352 is electrically connected to the second contact region 352 through the second lower contact 342.

A second insulating interlayer 354 is formed on the first insulating interlayer 327 to cover the first and the second insulation layer patterns 348 and 349. The second insulating interlayer 354 may be formed using an oxide by a CVD process, a PECVD process, an ALD process, or an HDP-CVD process. For example, the second insulating interlayer 354 may be formed using PSG, BPSG, USG, SOG, TEOS, PE-TEOS, FOX, HDP-CVD oxide, etc.

The second insulating interlayer 354 is partially removed by an etch back process, a CMP process, or a combination thereof until the first and the second insulation layer patterns 348 and 349 are exposed. For example, the second insulating interlayer 354 is etched using a slurry that includes an abrasive such as ceria having a high etching selectivity between an oxide and a nitride. Here, the first and the second insulation layer patterns 348, and 349 serve as polishing stop layers. When the second insulating interlayer 354 is partially removed, the first insulation layer pattern 348 and the pad 351 are buried in the second insulating interlayer 354. Accordingly, the second insulation layer pattern 349 and the lower wiring 352 may be simultaneously buried in the second insulating interlayer 354.

A third insulation layer 357 is formed on the second insulating interlayer 354, the first insulation layer pattern 348 and the second insulation layer pattern 349. The third insulation layer 357 may be formed using a nitride or an oxynitride by a CVD process, a PECVD process, an ALD process or an HDP-CVD process. A sacrificial layer 360 including an oxide is formed on the third insulation layer 357. The sacrificial layer 360 may be formed using oxide by a CVD process, a PECVD process, an ALD process or an HDP-CVD process.

Figure 20E:
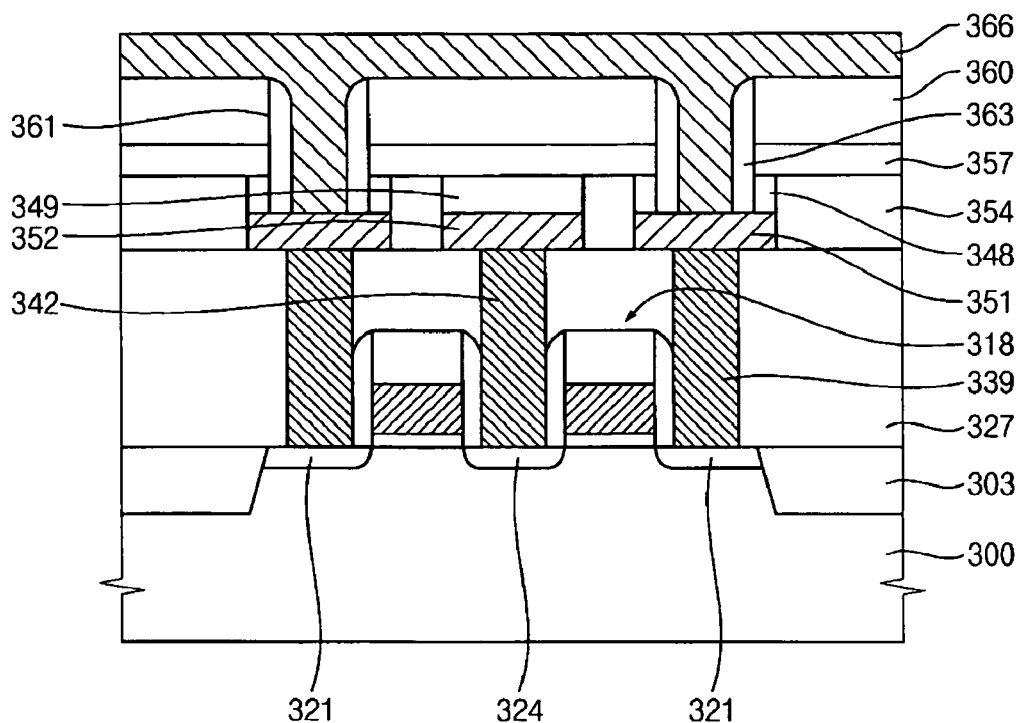

Referring to FIG. 20E, the sacrificial layer 360, the third insulation layer 357, and the first insulation layer pattern 348 are partially etched by a photolithography process so that an opening 361 exposing the pad 351 is formed. A fourth insulation layer (not shown) is formed on a sidewall of the opening 361, the pad 351 and the sacrificial layer 360 to fill up the opening 361. Then, the fourth insulation layer is anisotropically etched to form a preliminary spacer 363 on the sidewall of the opening 361. For example, the fourth insulation layer is formed using silicon nitride.

A third conductive layer 366 is formed on the pad 351 and the sacrificial layer 360 to fill up the opening 361. The third conductive layer 366 may be formed using doped polysilicon, a metal, or a conductive metal nitride. For example, the third conductive layer 366 may be formed using tungsten, tungsten nitride, titanium, titanium nitride, tantalum, tantalum nitride, molybdenum nitride, niobium nitride, titanium silicon nitride, aluminum, titanium aluminum nitride, titanium boron nitride, zirconium silicon nitride, tungsten silicon nitride, tungsten boron nitride, zirconium aluminum nitride, molybdenum silicon nitride, molybdenum aluminum nitride, tantalum silicon nitride, tantalum aluminum nitride, etc. These materials can be used alone or in a mixture thereof to form the third conductive layer 366. The third conductive layer 366 may be formed by a sputtering process, a CVD process, an ALD process, an electron beam evaporation process, a PLD process, etc.

Figure 20F:
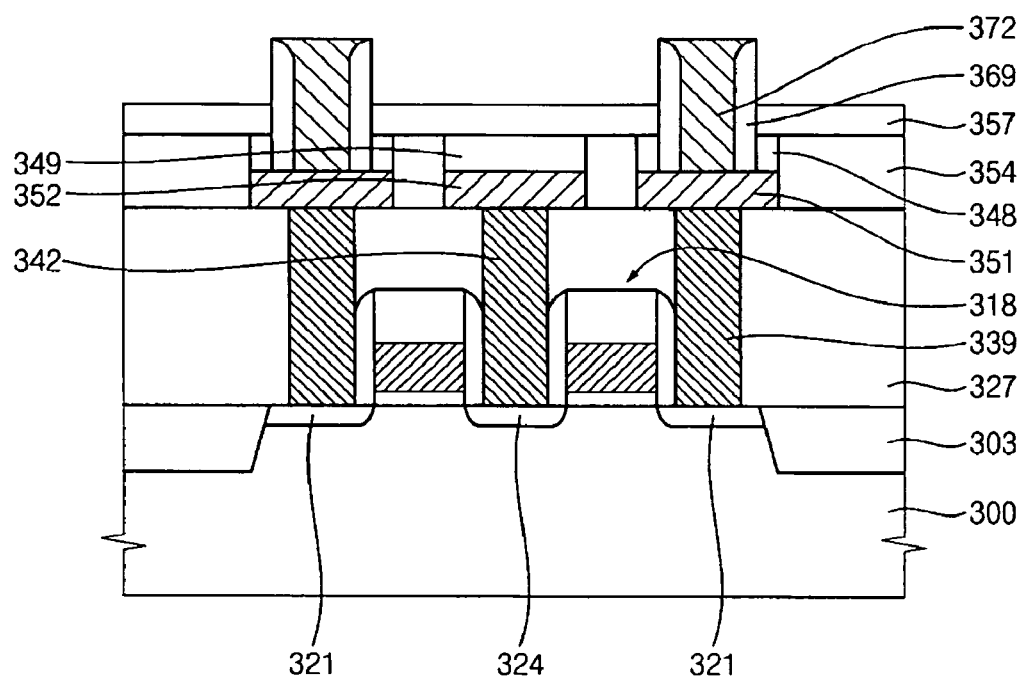

Referring to FIG. 20F, the third conductive layer 366 is partially removed by a CMP process until the sacrificial layer 360 (see FIG. 20E) is exposed, thereby forming a preliminary lower electrode 372 filling up the opening 361 (see FIG. 20E). The preliminary spacer 369 is located between the sidewall of the opening 361 (see FIG. 20E) and a sidewall of the preliminary lower electrode 372.

The sacrificial layer 360 (see FIG. 20E) is removed by an etch back process and/or a CMP process to expose the second insulation layer 357. When the sacrificial layer 360 is removed, the preliminary spacer 369 and the preliminary lower electrode 372 protrude from the second insulation layer 357 as pillar shapes.

Figure 20G:
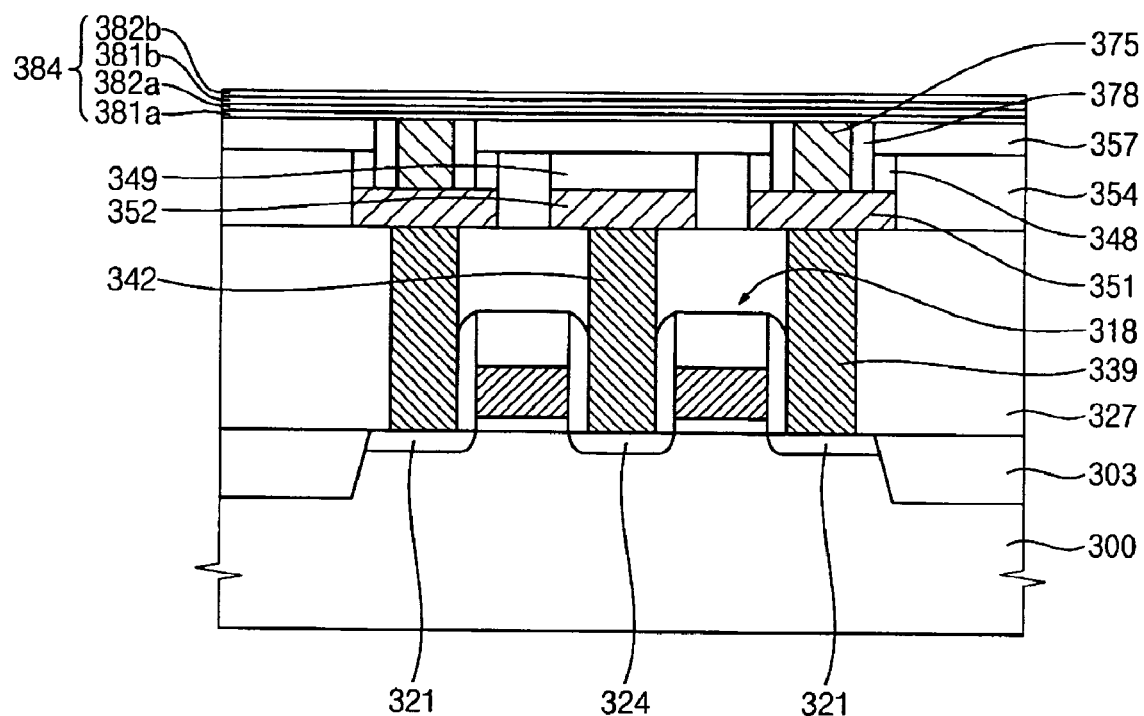

Referring to FIG. 20G, upper portions of the preliminary spacer 369 (see FIG. 20F) and the preliminary lower electrode 372 (see FIG. 20F) are removed by a CMP process to thereby simultaneously form a lower electrode 375 and a spacer 378 on the pad 351. For example, the lower electrode 378 and the spacer 375 are formed using a slurry that includes an abrasive such as ceria. The CMP process may be sufficiently performed to remove the second insulation layer 357 in formations of the lower electrode 375 and the spacer 378.

Figure 20H:
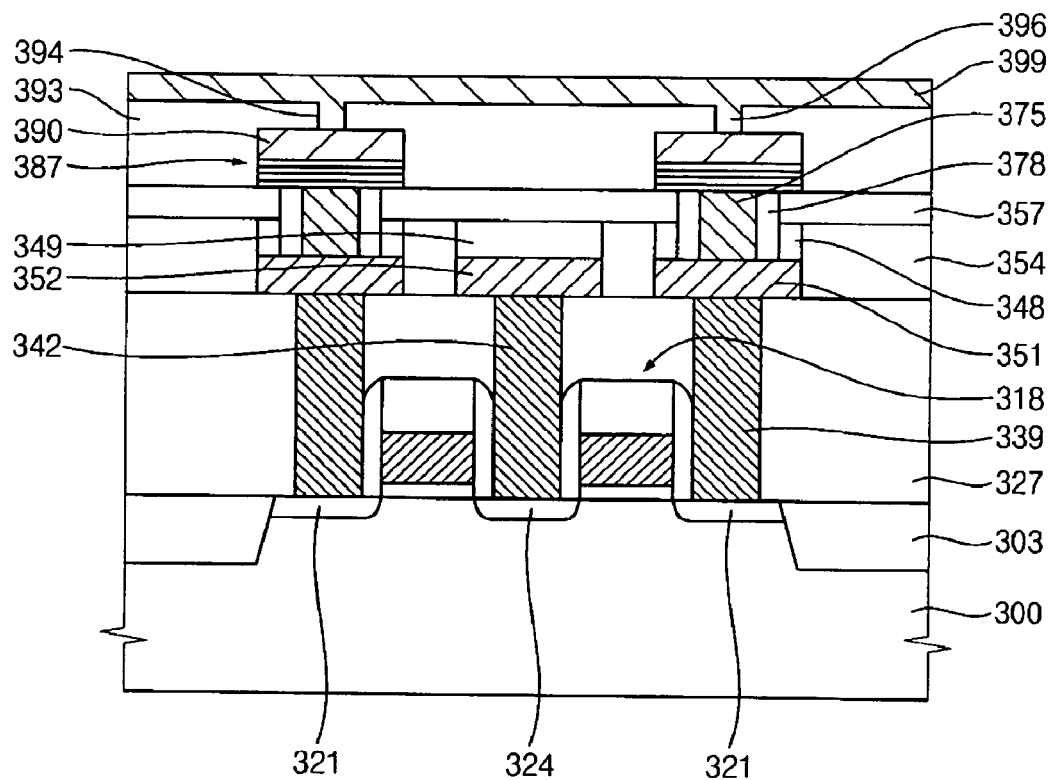

A phase changeable material layer 384 is formed on the second insulation layer 357, the lower electrode 375 and the spacer 378. The phase changeable material layer 384 includes a plurality of first composite material layers 381a and 381b, and a plurality of second composite material layers 382a and 382b. Each of the first composite material layers 381a and 381b may include germanium and tellurium, and each of the second composite material layers 382a and 382b may include antimony and tellurium, or vice versa. Accordingly, the phase changeable material layer 384 may include germanium-antimony-tellurium. The phase changeable material layer 384 may be formed by the methods described with reference to FIGS. 1 and 2. Although FIGS. 20G through 20H illustrate that the first and second composite layers 381 and 382 are physically identifiable, the first and second composite layers 381 and 382 may not be physically identifiable. In other words, the phase changeable material layer 384 may be a substantially homogenous layer having a substantially uniform GST concentration.

Referring to FIG. 20H, a fourth conductive layer (not shown) is formed on the phase changeable material layer 384 (see FIG. 20G). The fourth conductive layer may be formed using doped polysilicon, a metal or a conductive metal nitride by a sputtering process, a CVD process, an ALD process, an electron beam evaporation process, a PLD process, etc. The fourth conductive layer and the phase changeable material layer 384 (see FIG. 20G) are etched by a photolithography process so that a phase changeable material layer pattern 387 and an upper electrode 390 are sequentially formed on the lower electrode 378 and the second insulation layer 357. In particular, the phase changeable material layer pattern 387 is positioned on the lower electrode 378, the spacer 375 and the second insulation layer 357. The upper electrode 390 is located on the phase changeable material layer pattern 387.

A third insulating interlayer 393 is formed on the second insulation layer 357 to cover the upper electrode 390. The third insulating interlayer 393 may be formed using an oxide by a CVD process, a PECVD process, an ALD process or an HDP-CVD process. An upper contact hole 394 that exposes the upper electrode 390 is formed through the third insulating interlayer 393 by partially etching the third insulating interlayer 393 through a photolithography process. An upper contact 396 is formed on the upper electrode 390 in the upper contact hole 394, and an upper wiring 399 is formed on the upper contact 396 and the third insulating interlayer 393. The upper contact 396 and the upper wiring 399 may be integrally formed. The upper contact 396 and the upper wiring 399 may be formed using a metal or a conductive metal nitride by a sputtering process, a CVD process, an ALD process, an electron beam evaporation process or a PLD process.

Figure 21A:
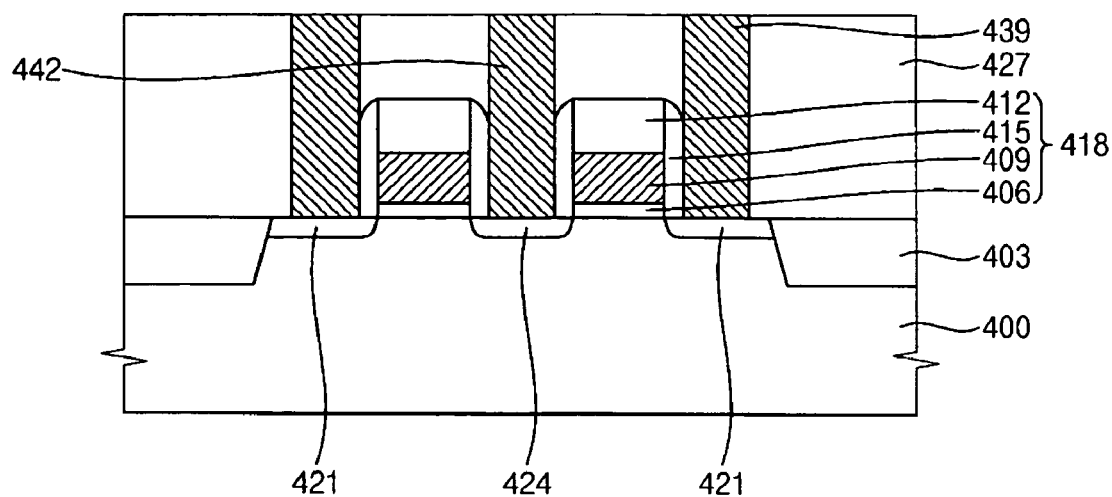
FIGS. 21A to 21E are cross-sectional views illustrating a method of manufacturing a phase changeable semiconductor memory device, according to another embodiment of the present invention.

FIGS. 21A to 21E are cross-sectional views illustrating a method of manufacturing a phase changeable semiconductor memory device according to another embodiment of the present general inventive concept. Referring to FIG. 21A, an isolation layer 403 is formed on a semiconductor substrate 400 to define an active region of the semiconductor substrate 400. A gate insulation layer (not shown), a gate conductive layer (not shown), and a gate mask layer (not shown) are sequentially formed on the active region of the semiconductor substrate 400. Then, the gate insulation layer, the gate conductive layer, and the gate mask layer are etched to thereby sequentially form a gate insulation layer pattern 406, a gate electrode 409, and a gate mask 412 on the semiconductor substrate 400. The gate electrode 409 may include a single layer structure that has a doped polysilicon layer, a metal layer, or a conductive metal nitride layer.

The gate electrode 409 may have a double layer structure that includes doped polysilicon layer, a metal layer, a conductive metal nitride layer, and/or a metal silicide layer. The gate mask 412 may be formed using a material that has an etching selectivity relative to the gate electrode 409 and the gate insulation layer pattern 406. After a first insulation layer (not shown) is formed on the semiconductor substrate 400 to cover the gate mask 412, the first insulation layer is anisotropically etched to form a gate spacer 415 on sidewalls of the gate insulation layer pattern 406, the gate electrode 409, and the gate mask 412. Hence, gate structures 418 are formed on the semiconductor substrate 400. Each of the gate structures 418 includes the gate insulation layer pattern 406, the gate electrode 409, and the gate mask 412. A first contact region 421 and a second contact region 424 are formed at portions of the semiconductor substrate 400 between the gate structures 418 by an ion implantation process using the gate structures 418 as implantation masks. As a result, transistors including the first contact region 421, the second contact region 424, and the gate structures 418 are formed on the semiconductor substrate 400.

A first insulating interlayer 427 is formed on the semiconductor substrate 400 to cover the gate structures 418. The first insulating interlayer 427 may be formed using an oxide by a CVD process, a PECVD process, an ALD process or an HDP-CVD process.

The first insulating interlayer 427 is partially etched by a photolithography process to form a first lower contact hole (not shown) and a second lower contact hole (not shown) that partially expose the first contact region 421 and the second contact region 424, respectively.

A first conductive layer (not shown) is formed on the first insulating interlayer 427 to fill up the first and the second lower contact holes. The first conductive layer may be formed using doped polysilicon, a metal, or a conductive metal nitride by a sputtering process, a CVD process, an ALD process, an electron beam evaporation process, or a PLD process.

The first conductive layer is then partially removed by a CMP process and/or an etch back process until the first insulating interlayer 427 is exposed so that a first lower contact 439 and a second lower contact 442 are formed in the first lower contact hole and the second lower contact hole. The first lower contact 439 is formed on the first contact region 421, and the second lower contact 442 is positioned on the second contact region 424.

Figure 21B:
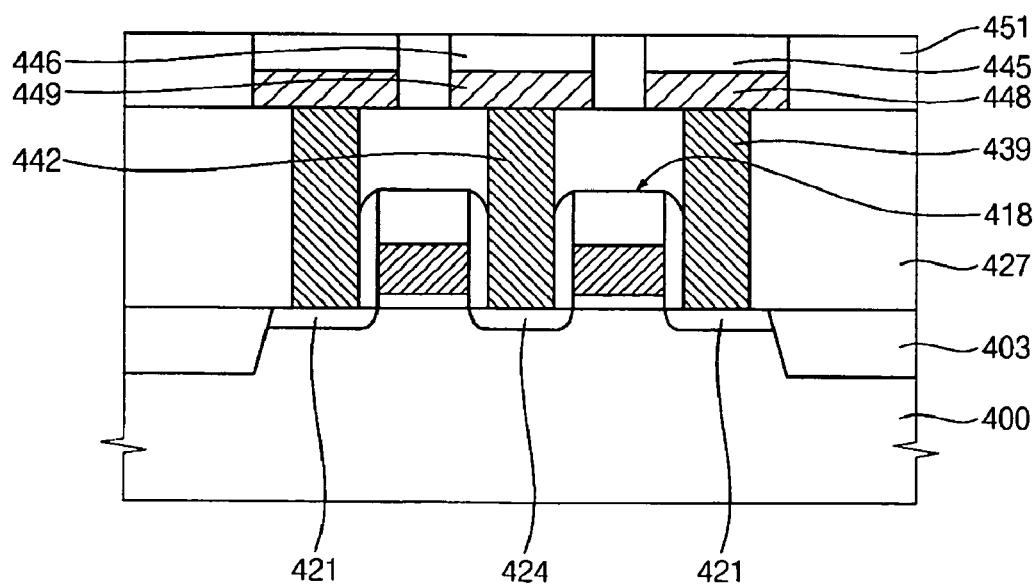

Referring to FIG. 21B, a second conductive layer (not shown) and a second insulation layer (not shown) are sequentially formed on the first lower contact 439, the second lower contact 442, and the first insulating interlayer 427. The second insulation layer may be formed using a nitride or an oxynitride by a CVD process, a PECVD process, an ALD process, or an HDP-CVD process.

The second conductive layer may be formed using doped polysilicon, a metal, or a conductive metal nitride by a sputtering process, a CVD process, an ALD process, an electron beam evaporation process, or a PLD process.

The second insulation layer is then partially etched by a photolithography process to simultaneously form a first insulation layer pattern 445 and a second insulation layer pattern 446. The first insulation layer pattern 445 is formed on one portion of the second conductive layer where the first lower contact 439 is positioned. The second insulation layer pattern 446 is formed on another portion of the second conductive layer under which the second lower contact 442 is positioned.

The second conductive layer is etched using the first and the second insulation layer patterns 445 and 446 as etching masks to thereby form a lower electrode 448 and a lower wiring 449. The lower electrode 448 is positioned on the first lower contact 439, and is electrically connected to the first contact region 421 through the first lower contact 439. The lower wiring 449 is formed on the second lower contact 442, and is electrically connected to the second contact region 424 through the second lower contact 442.

A second insulating interlayer 451 is formed on the first insulating interlayer 427 to cover the first and the second insulation layer patterns 445 and 446. The second insulating interlayer 451 may be formed using an oxide by a CVD process, a PECVD process, an ALD process, or an HDP-CVD process.

The second insulating interlayer 451 is partially removed by an etch back process and/or a CMP process until the first and the second insulation layer patterns 445 and 446 are exposed. For example, the second insulating interlayer 451 may be partially removed using a slurry that includes an abrasive such as ceria. Here, the first and the second insulation layer patterns 445 and 446 serve as polishing stop layers.

Figure 21C:
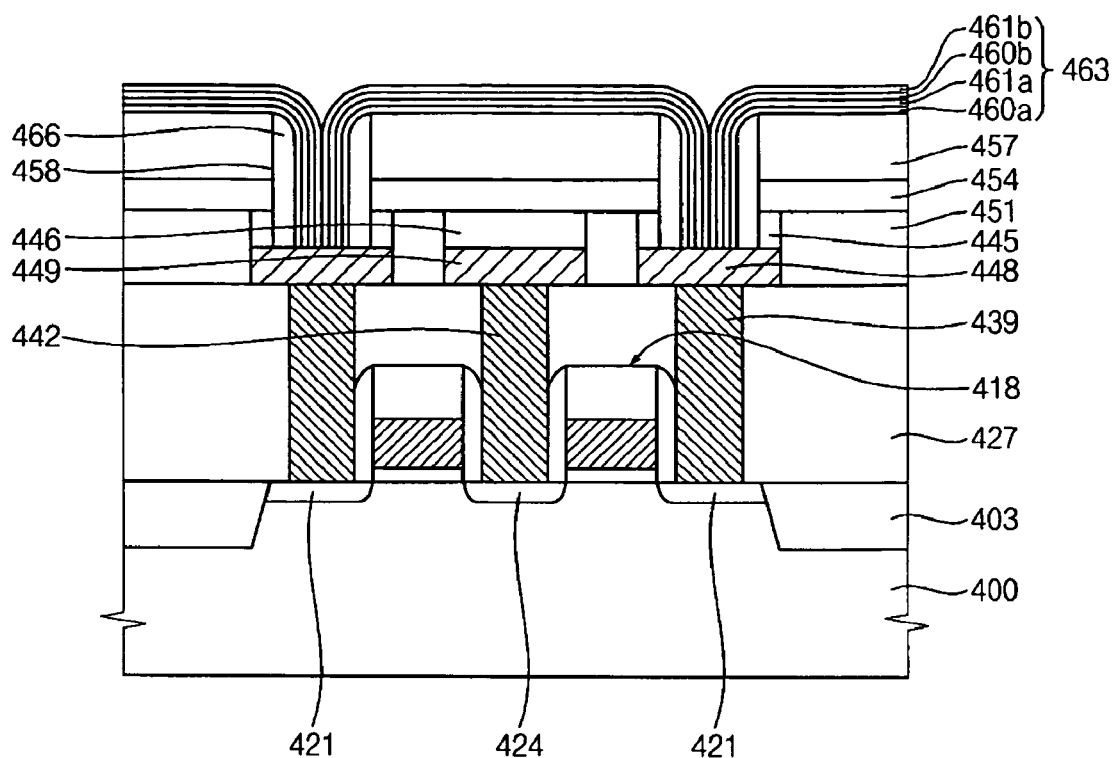

Referring to FIG. 21C, a third insulation layer 454 is formed on the second insulating interlayer 451, the first insulation layer pattern 445, and the second insulation layer pattern 446. The third insulation layer 454 may be formed using a nitride or an oxynitride by a CVD process, a PECVD process, an ALD process, or an HDP-CVD process. A sacrificial layer 457 is formed on the third insulation layer 227 using an oxide by a CVD process, a PECVD process, an ALD process, or an HDP-CVD process.

The sacrificial layer 457, the third insulation layer 451, and the first insulation layer pattern 445 are partially etched by a photolithography process, thereby forming an opening 458 that exposes the lower electrode 448. After a fourth insulation layer (not shown) is formed on the lower electrode 448, a sidewall of the opening 458 and the sacrificial layer 457 to fill up the opening 458. The fourth insulation layer is anisotropically etched to form a preliminary spacer 466 on the sidewall of the opening 458.

Figure 21D:
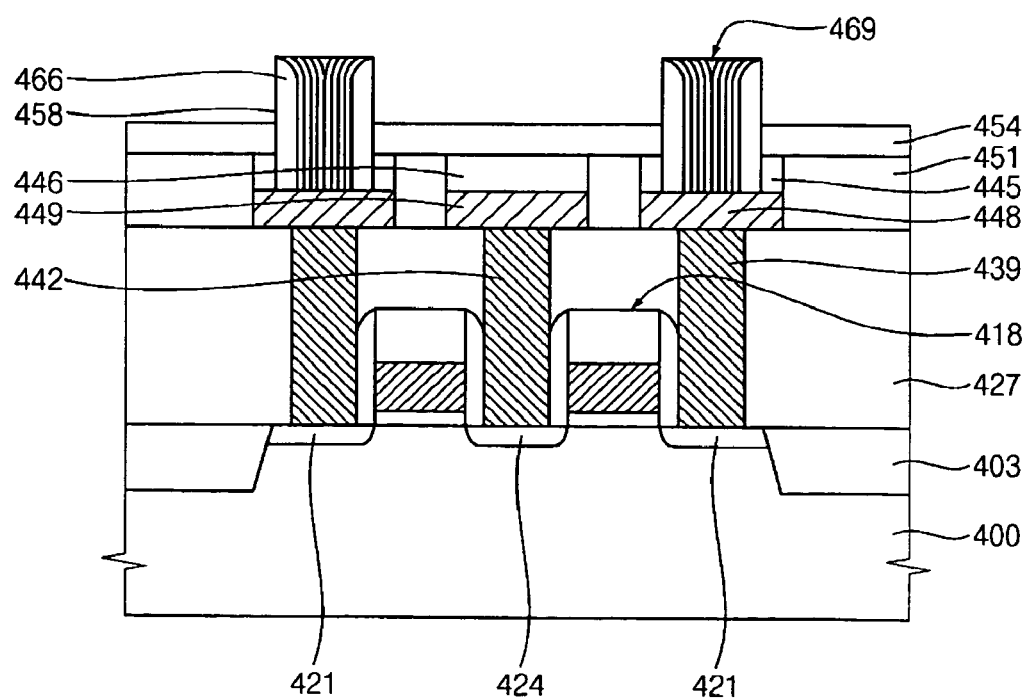
Figure 21E:
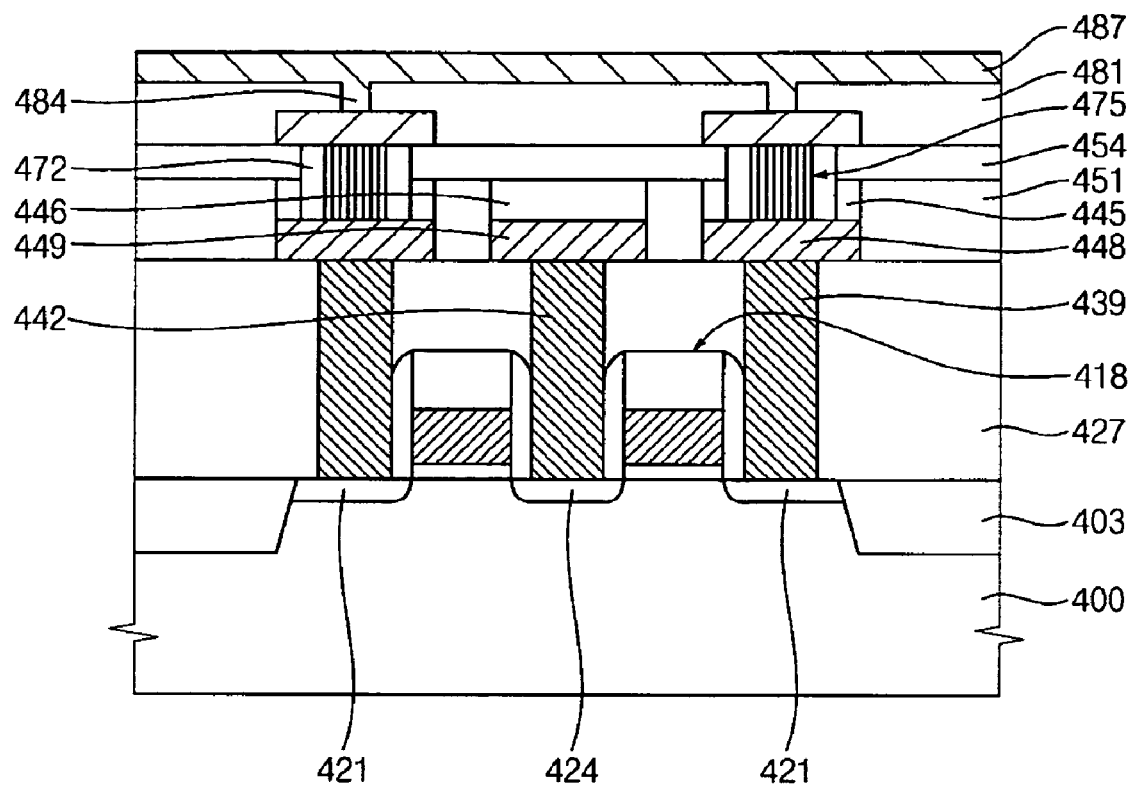

A phase changeable material layer 463 is formed on the lower electrode 448 and the sacrificial layer 457 to fill up the opening 458 by using the methods described with reference to FIGS. 1 and 2. The phase changeable material layer 463 includes a plurality of first composite material layers 460a and 460b, and a plurality of second composite material layers 461a and 461b. Each of the first composite material layers 460a and 460b may include germanium and tellurium, and each of the second composite material layers 461a and 461b may include antimony and tellurium, or vice versa. Therefore, the phase changeable material layer 463 includes germanium-antimony-tellurium. Although FIGS. 21C through 21E illustrate that the first and second composite layers 460 and 461 are physically identifiable, the first and second composite layers 460 and 461 may not be physically identifiable. In other words, the phase changeable material layer 463 may be a substantially homogenous layer having a substantially uniform GST concentration.

Referring to FIG. 21D, the phase changeable material layer 463 (see FIG. 21C) is partially removed by a CMP process until the sacrificial layer 457 is exposed so that a preliminary phase changeable material layer pattern 469 is formed on the lower electrode 448 in the opening 458. Here, the preliminary spacer 466 is positioned between the sidewall of the opening 458 and a sidewall of the preliminary phase changeable material layer pattern 469.

The sacrificial layer 457 (see FIG. 21C) is removed by an etch back process and/or a CMP process to expose the third insulation layer 454. When the sacrificial layer 457 is removed, the preliminary spacer 466 and the preliminary phase changeable material layer pattern 469 protrude from the third insulation layer 454 as pillar shapes.

Referring to FIG. 21E, upper portions of the preliminary spacer 466 and the preliminary phase changeable material layer pattern 469 are removed by a CMP process and/or an etch back process, thereby forming a spacer 472 and a phase changeable material layer pattern 475 on the lower electrode 448. For example, the spacer 472 and the phase changeable material layer pattern 475 may be formed using a slurry that includes an abrasive such as ceria. In formations of the spacer 472 and the phase changeable material layer pattern 475, the third insulation layer 454 serves as a polishing stop layer and/or an etch stop layer. The CMP process may be sufficiently performed to remove the third insulation layer 454 in the formations of the spacer 472 and the phase changeable material layer pattern 475.

An upper electrode 478 is formed on the third insulation layer 454, the spacer 472, and the phase changeable material layer pattern 475. The upper electrode 478 may be formed using doped polysilicon, a metal, or a conductive metal nitride by a sputtering process, a CVD process, an ALD process, an electron beam evaporation process, or a PLD process.

A third insulating interlayer 481 is formed on the third insulation layer 454 to cover the upper electrode 478. The third insulating interlayer 481 may be formed using an oxide by a CVD process, a PECVD process, an ALD process, or an HDP-CVD process.

After an upper contact hole (not shown) exposing the upper electrode 478 is formed through the third insulating interlayer 481 by partially etching the third insulating interlayer 481, an upper contact 484 is formed on the upper electrode 478 in the upper contact hole. An upper wiring 487 is formed on the upper contact 484 and the third insulating interlayer 481. The upper contact 484 and the upper wiring 487 may be integrally and simultaneously formed using doped polysilicon, a metal, or a conductive metal nitride.

In view of the foregoing, the various embodiments of the present general inventive concept provide a method of forming a phase changeable material layer having excellent characteristics using a plasma assisted process performed at a low temperature to achieve an appropriate composition of the phase changeable material layer. The various embodiments of the present general inventive concept also provide a method of fabricating a phase changeable material memory unit and a phase changeable random access memory (PRAM) device.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A method of fabricating a phase changeable material layer usable in a semiconductor memory device, the method comprising:

forming a plasma in a chamber having a substrate disposed therein;

applying a first source gas of a germanium based material to deposit a layer of the germanium based material on the substrate while maintaining the plasma in the chamber;

applying a second source gas of a tellurium based material to react with the layer of the germanium based material to form a germanium-tellurium composite material on the substrate while maintaining the plasma in the chamber;

applying a third source gas of an antimony based material to deposit a layer of the antimony based material on the germanium-tellurium composite material while maintaining the plasma in the chamber; and applying a fourth source gas of tellurium based material to react with the layer of antimony based material to form an antimony-tellurium composite material on the germanium-tellurium composite material.

2. The method of claim 1, further comprising:
purging the chamber of the germanium based material source gas that is not chemisorbed on the substrate;
purging the chamber of the tellurium based material source gas that does riot react with the germanium based material layer;
purging the chamber of the antimony based material source gas that is not deposited on the germanium-tellurium composite material; and
purging the chamber of the tellurium based material source gas that does not react with the antimony based material layer.

3. A method of forming a phase changeable material layer on a substrate in a reaction chamber, the method comprising:
performing a plurality of first unit processes having one or more cycles to form germanium-tellurium layers; and
performing a plurality of second unit processes having one or more cycles to form antimony-tellurium layers, wherein the first and second unit processes are plasma assisted.

4. The method of claim 3, wherein the plurality of first unit processes comprise:
applying a first flow amount of germanium source gas in the reaction chamber having the substrate; and
applying a second flow amount of tellurium source gas such that the first and second flow amounts have a ratio of about 1 to 0.2-0.4.

5. The method of claim 3, wherein the plurality of second unit processes comprise:
applying a first flow amount of antimony source gas in the reaction chamber having the substrate; and
applying a second flow amount of tellurium source gas such that the first and second flow amounts have a ratio of about 2 to 1.

6. The method of claim 3, wherein the plurality of second unit processes comprise:
applying a first flow amount of germanium source gas in the reaction chamber having the substrate; and
applying a second flow amount of tellurium source gas such that the first and second flow amounts have a ratio of about 1 to 0.2-0.4.

7. The method of claim 3, wherein the plurality of first unit processes comprise:
applying a first flow amount of antimony source gas in the reaction chamber having the substrate; and
applying a second flow amount of tellurium source gas such that the first and second flow amounts have a ratio of about 2 to 1.

8. A method of forming a phase changeable material layer in a reaction chamber, the method comprising:
performing a first chemical vapor deposition process on a substrate using a first source gas including chalcogenide materials while generating a plasma in the reaction chamber;
purging the first source gas while maintaining the plasma in the reaction chamber;
performing a second chemical deposition process on a substrate using a second source gas including chalcogenide materials while maintaining the plasma in the reaction chamber, the second source gas being different from the first source gas;
purging the second source gas while maintaining the plasma in the reaction chamber;
performing a third chemical vapor deposition process on a substrate using a third source gas including chalcogenide materials while maintaining the plasma in the reaction chamber, the third source gas being different from the second source gas; and
purging the third source gas while maintaining the plasma in the reaction chamber.

9. The method of claim 8, wherein the performing of the chemical vapor depositions comprises performing alternating chemical vapor depositions of germanium, antimony, and tellurium to form a germanium-antimony-tellurium material having a composition ratio of approximately 2:2:5.

10. The method of claim 8, wherein the performing of the chemical vapor depositions forms the phase changeable material layer to have a face centered cubic (FCC) structure grown along a (2-0-0) plane as a dominant crystalline structure.

11. The method of claim 8, wherein the performing of the chemical vapor depositions comprises forming a hydrogen plasma in the reaction chamber by introducing hydrogen gas at a constant flow rate of bout 50 to 200 sccm.

12. The method of claim 8, wherein the performing of the chemical vapor depositions comprises forming an argon plasma in the reaction chamber by introducing argon gas at a constant flow rate of about 200 to 400 sccm.

13. The method of claim 8, wherein the performing of the chemical vapor depositions comprises forming a hydrogen/argon plasma in the reaction chamber by introducing argon and hydrogen gases at constant flow rates having a ratio of about 0.5.

14. The method of claim 8, wherein the performing of the chemical vapor depositions comprises:
applying a germanium-based source gas at a predetermined flow rate for a first feeding time;
applying a tellurium-based source gas at the predetermined flow rate for a second feeding time; and
applying an antimony-based source gas at the predetermined flow rate for a third feeding time, wherein the predetermined flow rate is between 50 and 200 sccm.

15. The method of claim 14, wherein the first feeding time is in a first range of between 0.1 to about 2.0 seconds, the second feeding time is in a second range of between 0.1 to 2.0 seconds, and the third feeding time is in a range of between 0.1 to 20 seconds.

16. The method of claim 14, wherein:
the germanium-based source gas includes one or more of Ge(iPro)3H, GeCl4, Ge(Me)4, Ge(Me)4N3, Ge(Et)4, Ge(Me)3NEt2, Sb(GeMe3)3, Ge(nBu)4, Sb(GeEt3)3, and Ge(Cp)2;
the tellurium-based source gas includes one or more of Te(iBu)2, TeCl4, Te(Me)2, Te(Et)2, Te(nPr)2, Te(iPr)2, and Te(tBu)2; and
the antimony-based source gas includes one or more of Sb(iBu)3, SbCl3, SbCl5, Sb(Me)3, Sb(Et)3, Sb(nPr)3, Sb(tBu)3, Sb[N(Me)2]3, and Sb(Cp)3.

17. The method of claim 8, wherein the performing of the chemical vapor depositions on the substrate comprises forming the phase changeable material layer on the substrate to have a sheet resistance of about 825 ohms per square centimeter.

18. The method of claim 8, wherein a temperature of the reaction chamber is maintained between 100 and 200 degrees Celsius.

19. The method of claim 8, wherein the plasma is maintained constantly while performing the first, second, and third chemical deposition processes, and purging the first, second and third source gases.

20. A method of forming a phase changeable material layer, the method comprising:

repeating a plasma assisted chemical vapor deposition cycle on a substrate, including:
  producing plasma including a hydrogen plasma and/or an argon plasma in a reaction chamber;
  introducing a germanium based source gas, a tellurium based source as and an antimony based source gas to react on the substrate; and
  purging the reaction chamber of each of an unreacted germanium based source gas, an unreacted tellurium based source gas and an unreacted antimony based source gas while maintaining the plasma in the reaction chamber.

21. The method of claim 20, wherein the plasma is maintained constantly while repeating the plasma assisted chemical vapor deposition cycle on a substrate.

22. A method of forming a phase changeable material layer, the method comprising:
  forming a plasma in a reaction chamber having a substrate therein; and
  supplying a germanium based source gas, an antimony based source gas, and a tellurium based source gas into the reaction chamber in flow amounts having a ratio of about 5:2-4:2-4, respectively, to deposit layers on the substrate.

23. A method of forming a phase changeable material layer using plasma assisted chemical vapor deposition, the method comprising:
  feeding a first source gas of a first chalcogenide material into a reaction chamber for a first feed amount such that the first chalcogenide is chemisorbed on a substrate disposed in the reaction chamber;
  feeding a second source gas of a second chalcogenide material into the reaction chamber for a second feed amount such that the second chalcogenide material reacts with the first chalcogenide material to form at least one first composite material layer;
  feeding a third source gas of a third chalcogenide material into the reaction chamber for a third feed amount such that the third chalcogenide material is deposited on the at least one first composite material layer; and
  feeding the second source gas of the second chalcogenide material into the reaction chamber for a fourth feed amount such that the second chalcogenide material reacts with the third chalcogenide material to form at least one second composite material layer on the at least one first composite layer.

24. The method of claim 23, further comprising:
  purging the reaction chamber in between each feeding operation for a predetermined amount of time.

25. A method of forming a phase changeable material, the method comprising:
  generating a plasma in a reaction chamber;
  introducing a second chalcogenide material into the reaction chamber to read with first chalcogenide material to form a first layer;
  purging the second chalcogenide material while maintaining the plasma in the reaction chamber;
  forming a second layer of a third chalcogenide material on the first layer;
  purging the third chalcogenide material while maintaining the plasma in reaction chamber; and
  introducing more of the second chalcogenide material into the reaction chamber to react with the third chalcogenide material in the second layer.

26. A method of fabricating a phase changeable memory device, the method comprising:
  forming one or more insulating layers on a substrate;
  forming a first electrode on the one or more insulating layers;
  forming a phase changeable material to contact the first electrode by performing alternating chemical vapor depositions of germanium, antimony, and tellurium using a constant plasma source; and
  forming a second electrode to contact the phase changeable material on an opposite side of the first electrode;
  wherein performing the chemical vapor depositions includes:
    providing a first source gas including a first chalcogenide material into a reaction chamber for a first feed amount such that the first chalcogenide is chemisorbed on a substrate disposed in the reaction chamber;
    providing a second source gas including a second chalcogenide material into the reaction chamber for a second feed amount such that the second chalcogenide material reacts with the first chalcogenide material to form at least one first composite material layer;
    providing a third source gas including a third chalcogenide material into the reaction chamber for a third feed amount such that the third chalcogenide material is deposited on the at least one first composite material layer; and
    providing the second source gas including the second chalcogenide material into the reaction chamber for a fourth feed amount such that the second chalcogenide material reacts with the third chalcogenide material to form at least one second composite material layer on the at least one first composite layer.

27. A method of fabricating a phase changeable memory device, the method comprising:
  forming a lower electrode on a substrate;
  forming a phase changeable material layer on the lower electrode by performing a plurality of plasma assisted chemical vapor deposition operations of a plurality of chalcogenide materials; and
  forming an upper electrode on the phase changeable material layer;
  wherein performing the plasma assisted chemical vapor depositions includes:
    providing a first source gas including a first chalcogenide material into a reaction chamber for a first feed amount such that the first chalcogenide is chemisorbed on a substrate disposed in the reaction chamber;
    providing a second source gas including a second chalcogenide material into the reaction chamber for a second feed amount such that the second chalcogenide material reacts with the first chalcogenide material to form at least one first composite material layer;
    providing a third source gas including a third chalcogenide material into the reaction chamber for a third feed amount such that the third chalcogenide material is deposited on the at least one first composite material layer; and
    providing the second source gas including the second chalcogenide material into the reaction chamber for a fourth feed amount such that the second chalcogenide material reacts with the third chalcogenide material to form at least one second composite material layer on the at least one first composite layer.

* * * * *